US010396162B2

(12) United States Patent
Kitamura

(10) Patent No.: US 10,396,162 B2
(45) Date of Patent: Aug. 27, 2019

(54) SILICON CARBIDE SEMICONDUCTOR DEVICE

(71) Applicant: FUJI ELECTRIC CO., LTD., Kawasaki-shi, Kanagawa (JP)

(72) Inventor: Shoji Kitamura, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/632,939

(22) Filed: Jun. 26, 2017

(65) Prior Publication Data
US 2018/0061951 A1 Mar. 1, 2018

(30) Foreign Application Priority Data

Aug. 25, 2016 (JP) .................... 2016-165174

(51) Int. Cl.
H01L 29/16 (2006.01)
H01L 29/66 (2006.01)
H01L 29/78 (2006.01)
H01L 29/872 (2006.01)
H01L 29/06 (2006.01)

(52) U.S. Cl.
CPC ...... *H01L 29/1608* (2013.01); *H01L 29/0619* (2013.01); *H01L 29/0692* (2013.01); *H01L 29/6606* (2013.01); *H01L 29/66068* (2013.01); *H01L 29/7839* (2013.01); *H01L 29/872* (2013.01); *H01L 29/0615* (2013.01)

(58) Field of Classification Search
CPC ............. H01L 29/6606; H01L 29/1608; H01L 29/7839; H01L 29/872; H01L 29/66128; H01L 29/66143; H01L 2924/12032
See application file for complete search history.

(56) References Cited

U.S. PATENT DOCUMENTS

| 2008/0277668 A1 | 11/2008 | Okuno et al. |
| 2010/0032730 A1 | 2/2010 | Endo et al. |
| 2011/0175106 A1 | 7/2011 | Mizukami et al. |
| 2012/0223332 A1 | 9/2012 | Kamaga et al. |
| 2012/0223333 A1 | 9/2012 | Mizukami |
| 2012/0241762 A1 | 9/2012 | Noda et al. |

FOREIGN PATENT DOCUMENTS

| JP | 2008-282972 A | 11/2008 |
| JP | 2010-087483 A | 4/2010 |
| JP | 2012-182405 A | 9/2012 |
| JP | 5175872 B2 | 4/2013 |
| JP | 5306392 B2 | 10/2013 |
| JP | 5546759 B2 | 7/2014 |
| JP | 5550589 B2 | 7/2014 |

*Primary Examiner* — Tucker J Wright
(74) *Attorney, Agent, or Firm* — Rabin & Berdo, P.C.

(57) ABSTRACT

A silicon carbide semiconductor device includes a first semiconductor layer of a first conductivity type provided on a front surface of a silicon carbide semiconductor substrate of the first conductivity type; a first semiconductor region of a second conductivity type; a second semiconductor region of the second conductivity type, connected with the first semiconductor region; a first electrode forming a Schottky contact with a first semiconductor layer and a first semiconductor region; and a second electrode forming an ohmic contact with the second semiconductor region. A density of the second electrode is lower at a center portion of the silicon carbide semiconductor substrate and increases toward an outer peripheral side.

19 Claims, 22 Drawing Sheets

SILICON CARBIDE SEMICONDUCTOR DEVICE

CROSS REFERENCE TO RELATED APPLICATIONS

This application is based upon and claims the benefit of priority of the prior Japanese Patent Application No. 2016-165174, filed on Aug. 25, 2016, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Recently, semiconductor devices using a silicon carbide (SiC) semiconductor material (hereinafter, silicon carbide semiconductor devices) have been attracting attention as elements that exceed the limitations of semiconductor devices that use a silicon (Si) semiconductor material. In particular, compared to a silicon semiconductor, a silicon carbide semiconductor has high critical electric field strength and is expected to be applied to high-voltage elements by taking advantage of its attribute of high thermal conductivity.

A Schottky Barrier Diode (SBD) structure is common for a diode structure using SiC up to about 3300V since epitaxial film specifications of low film thickness and high impurity concentration are possible. FIG. 27 is a top view of a structure of a conventional silicon carbide diode. The silicon carbide diode includes an active region 20 in which an element structure is formed and in which current flows in an ON state. The silicon carbide diode further includes an edge termination region 30 that mitigates electric field on a base front surface side of a drift region and sustains the breakdown voltage, and a p$^+$-type guard ring region 5 of a boundary of the active region 20 and the edge termination region 30.

An ordinary SBD structure has a problem of reverse current consequent to high electric field strength at the SBD surface and a problem of tunneling or reverse current increases caused by surface defects particular to SiC. Therefore, a diode has been proposed that employs a junction barrier Schottky (JBS) structure having a mixture of a Schottky junction and a PN junction. FIG. 28 is a top view of a structure of a silicon carbide diode having a conventional JBS structure. As depicted in FIG. 28, a p-type well region 3 for forming a JBS structure is formed. Use of the JBS structure enables surface electric field strength to be reduced and reverse current equivalent to a Si free wheeling diode (FWD) becomes possible.

Further, in the SBD structure depicted in FIG. 27, forward surge current is small, which is because the SBD is a unipolar device whereby resistance becomes high in a high current region and defects of the Schottky junction and of an n-type silicon layer directly below occur consequent to local current concentration resulting from generated surface heat. With a JBS structure like that in FIG. 28, forward surge current is expected to increase by the rising phenomenon of current consequent to bipolar operation of a PN portion. However, in a Si JBS structure, although forward surge current increases are recognized, for SiC, the effect does not significantly appear. One factor is that a sufficient ohmic contact with a p-type SiC portion of the JBS structure is not obtained.

Thus, by forming an electrode (ohmic electrode) for which ohmic contact with the p-type SiC portion is enhanced, it is thought that in a high-current operating region, current flows locally in a PN junction portion of the JBS structure portion, enhancing the forward surge current.

In this regard, in Japanese Patent No. 5546759, Japanese Laid-Open Patent Publication No. 2008-282972, a technique of forming a Schottky electrode after forming an ohmic electrode on a p$^+$-type layer is disclosed. Use of aluminum (Al), nickel (Ni) for the ohmic electrode, use of molybdenum (Mo) for the Schottky electrode, and formation of a high-concentration p$^{++}$-type layer in the p-type well region to enhance the ohmic contact property is described. However, the p-type well region pattern is an ordinary JBS structure, and there is no clear description related to surge capability enhancement. Further, Japanese Laid-Open Patent Publication No. 2010-87483 discloses a technique of optimizing the width and concentration of the p-type well region to reduce the voltage rise of the p-type well region.

Concerning the p-type well region pattern, Japanese Patent No. 5306392 discloses a pattern for reducing the rising voltage of the p-type well region for surge capability enhancement. The disclosure includes a p-type well region having a width of 15 µm or greater and a P-type well region having a width less than 15 µm. Further, Japanese Patent No. 5175872 discloses that in particular, for 3300V or higher voltage ratings, a width of 15 µm or greater between p-type well regions and if possible, 36 µm or greater is desirable.

Japanese Patent No. 5550589 discloses enhancement of rising voltage of a p-type well region by a technique of forming ohmic contact stripes along a vertical direction in the p-type well region of JBS structure. The p-type well regions and contact stripes are arranged at regular intervals. Further, Japanese Laid-Open Patent Publication No. 2012-182405 discloses formation of a region in which a diffusion depth of a portion of a p-type well region of a JBS structure is made deep and the rising voltage of the p-type well region is reduced.

SUMMARY OF THE INVENTION

According to one aspect of the present invention, a silicon carbide semiconductor device includes a first semiconductor layer of a first conductivity type, formed on a front surface of a silicon carbide semiconductor substrate of the first conductivity type; a first semiconductor region of a second conductivity type, selectively formed in a surface of the first semiconductor layer; a second semiconductor region of the second conductivity type, selectively formed in the surface of the first semiconductor layer so as to be connected with the first semiconductor region; a first electrode forming a Schottky contact with the first semiconductor layer and the first semiconductor region; and a second electrode forming an ohmic contact with the second semiconductor region. A density of the second electrode is lower at a center portion of the silicon carbide semiconductor substrate and increases toward an outer peripheral side.

The silicon carbide semiconductor device includes an active region through which main current flows, the active region being formed on the silicon carbide semiconductor substrate; and an edge termination region surrounding a periphery of the active region. The active region is constituted by the center portion and an outer peripheral portion surrounding the center portion. The second semiconductor region is formed in the outer peripheral portion of the active region. The second electrode is formed on a surface of the second semiconductor region.

In the silicon carbide semiconductor device, the second electrode has one of a contiguous structure, a dot structure, and a stripe structure.

In the silicon carbide semiconductor device, element breakdown voltage is 1700V or higher.

According to another aspect of the present invention, a method of manufacturing a silicon carbide semiconductor device, includes forming a first semiconductor layer of a first conductivity type, the first semiconductor layer being formed on a front surface of a silicon carbide semiconductor substrate of the first conductivity type; selectively forming a first semiconductor region of a second conductivity type, the first semiconductor region being formed in a surface of the first semiconductor layer; selectively forming a second semiconductor region of the second conductivity type, the second semiconductor region being formed in the surface of the first semiconductor layer so as to be connected with the first semiconductor region; forming a first electrode so as to form a Schottky contact with the first semiconductor layer and the first semiconductor region; and forming a second electrode so as to form an ohmic contact with the second semiconductor region. The second electrode is formed so as to have a density that is lower at a center portion of the silicon carbide semiconductor substrate and increases toward an outer peripheral side.

According to another aspect of the invention, a silicon carbide semiconductor device includes a first semiconductor layer of a first conductivity type, formed on a front surface of a silicon carbide semiconductor substrate of the first conductivity type; a first semiconductor region of a second conductivity type, selectively formed in a surface of the first semiconductor layer; a second semiconductor region of the second conductivity type, selectively formed in the surface of the first semiconductor layer so as to be connected with the first semiconductor region; a first electrode forming a Schottky contact with the first semiconductor layer and the first semiconductor region; and a second electrode forming an ohmic contact with the second semiconductor region. A density of the second electrode is higher at a center portion of the silicon carbide semiconductor substrate and decreases toward an outer peripheral side.

The silicon carbide semiconductor device includes an active region through which main current flows, the active region being formed on the silicon carbide semiconductor substrate; and an edge termination region surrounding a periphery of the active region. The active region is constituted by the center portion and an outer peripheral portion surrounding the center portion. The second semiconductor region is formed in the center portion of the active region. The second electrode is formed on a surface of the second semiconductor region.

In the silicon carbide semiconductor device, the second electrode has one of a contiguous structure, a dot structure, and a stripe structure.

In the silicon carbide semiconductor device, the second electrode is an electrode to which is connected, a wire electrically connected an external destination.

The silicon carbide semiconductor device includes a passivation film covering the second electrode. The wire is connected at an opening of the passivation film.

In the silicon carbide semiconductor device, element breakdown voltage is 1200V or less.

According to another aspect of the invention, a method of manufacturing a silicon carbide semiconductor device, includes forming a first semiconductor layer of a first conductivity type, the first semiconductor layer being formed on a front surface of a silicon carbide semiconductor substrate of the first conductivity type; selectively forming a first semiconductor region of a second conductivity type, the first semiconductor region being formed in a surface of the first semiconductor layer; selectively forming a second semiconductor region of the second conductivity type, the second semiconductor region being formed in the surface of the first semiconductor layer so as to be connected with the first semiconductor region; forming a first electrode so as to form a Schottky contact with the first semiconductor layer and the first semiconductor region; and forming a second electrode so as to form an ohmic contact with the second semiconductor region. The second electrode is formed so as to have a density that is higher at a center portion of the silicon carbide semiconductor substrate and decreases toward an outer peripheral side.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
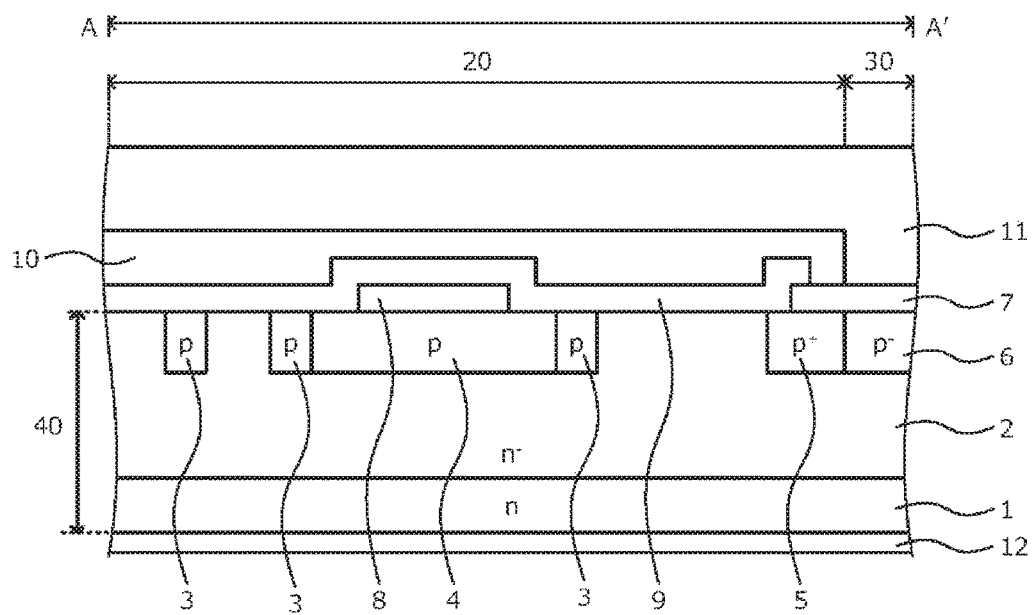
FIG. 1 is a cross-sectional view of a structure of a silicon carbide semiconductor device according to a first embodiment, along cutting line A-A' in FIG. 6.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or – appended to n or p means that the impurity concentration is higher or lower, respectively, than layers and regions without + or –, and represents one example. In the description of the embodiments below and the accompanying drawings, main portions that are identical will be given the same reference numerals and will not be repeatedly described.

A semiconductor device according to the present invention is configured using a wide bandgap semiconductor. In a first embodiment, concerning a silicon carbide semiconductor device produced using, for example, SiC as a wide bandgap semiconductor, a SBD having a JBS structure will be described as an example. FIG. 1 is a cross-sectional view of a structure of the silicon carbide semiconductor device according to the first embodiment, along cutting line A-A' in FIG. 6.

As depicted in FIG. 1, the semiconductor device according to the first embodiment includes on a semiconductor base containing silicon carbide (hereinafter, silicon carbide base (semiconductor substrate (semiconductor chip))) 40, the active region 20 and the edge termination region 30 surrounding a periphery of the active region 20. The active region 20 is a region in which current flows in the ON state. The edge termination region 30 is a region that mitigates the electric field on the base front surface side of the drift region and sustains the breakdown voltage.

The silicon carbide base 40 is formed by stacking on a front surface of an n-type silicon carbide substrate 1 containing silicon carbide (silicon carbide semiconductor substrate of a first conductivity type), an n$^-$-type drift layer 2 containing silicon carbide (first semiconductor layer of the first conductivity type). In the active region 20, the p-type well region 3 forming the JBS structure and a p-type region 4 are selectively formed in a surface layer of a first side (base front surface side) of the n$^-$-type drift layer 2 opposite a second side of the n$^-$-type drift layer 2, the second side facing the n-type silicon carbide substrate 1. The p-type well region 3 is provided to be in contact with the p-type region 4. Further, one p$^+$-type guard ring region 5 of a ring-shape surrounding the active region 20 is arranged outside the p-type well region 3 and the p-type region 4 (for example, refer to FIGS. 5 to 7).

Further, in the edge termination region 30, in the surface layer of the first side (base front surface side) of the n$^-$-type drift layer 2, a p$^-$-type junction termination extension (JTE) region 6 for enhancing the breakdown voltage of the high-voltage semiconductor device overall by mitigating or dispersing the electric field of the edge termination region 30 is selectively provided. The JTE region 6 is provided so as to surround the p$^+$-type guard ring region 5.

In a portion of the active region 20 on the front surface side of the silicon carbide base 40, an ohmic electrode (second electrode) 8 forming an ohmic contact with the p-type region 4, and a Schottky electrode (first electrode) 9 forming a Schottky contact with the n$^-$-type drift layer 2 and the p-type well region 3 are provided. Here, a portion of the surface of the p-type region 4 in contact with the ohmic electrode 8 becomes an ohmic contact region (hereinafter, may be indicated as simply, "contact region"). Further, an upper electrode 10 covers the Schottky electrode 9, a passivation film 11 containing polyimide is provided to protect the upper electrode 10 and an interlayer insulating film 7 described hereinafter. Further, on a rear surface of the silicon carbide base 40 (rear surface of the n-type silicon carbide substrate 1), a lower electrode 12 is provided.

The interlayer insulating film 7 covers the JTE region 6 of the edge termination region 30. In other words, the JTE region 6 of the edge termination region 30 is electrically insulated from the Schottky electrode 9 and the upper electrode 10 by the interlayer insulating film 7. An inner end of the interlayer insulating film 7 extends on the p$^+$-type guard ring region 5.

Figure 2:
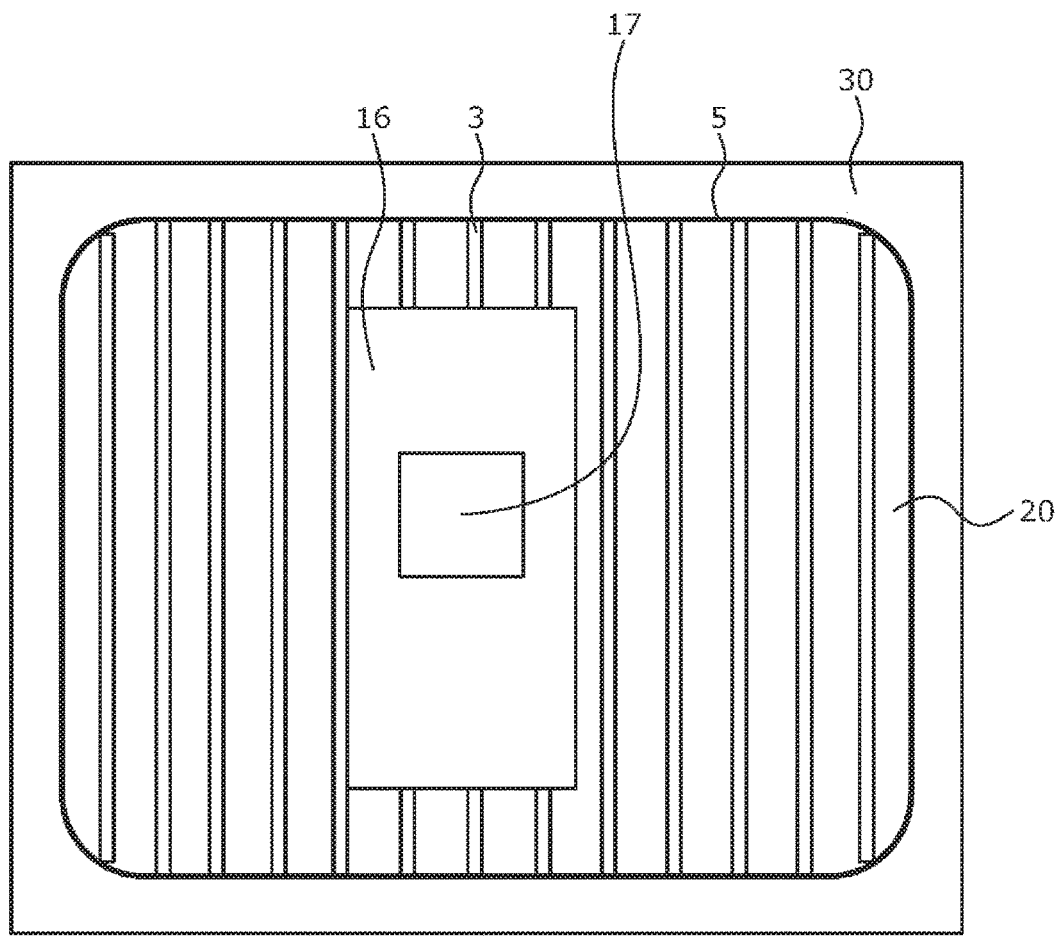
FIG. 2 is a top view in a case of wiring in a silicon carbide diode having a conventional JBS structure.

Here, the flow of forward surge current has been found to differ in the surface according to the voltage rating of the silicon carbide diode. FIG. 2 is a top view in a case of wiring in the silicon carbide diode having a conventional JBS structure. As depicted in FIG. 2, a case in which current is supplied from an Al wire is considered. This scheme is one of the most commonly used methods. FIG. 2 depicts an Al wire contact portion 17 that is a contact portion of a chip surface of the Al wire and a bonding pad 16 of the actual foundation. For example, when a 500-μmφ Al wire is used, the Al wire contact portion 17 has to be assumed to be about 1 mm in substantially 4 directions.

Figure 3:
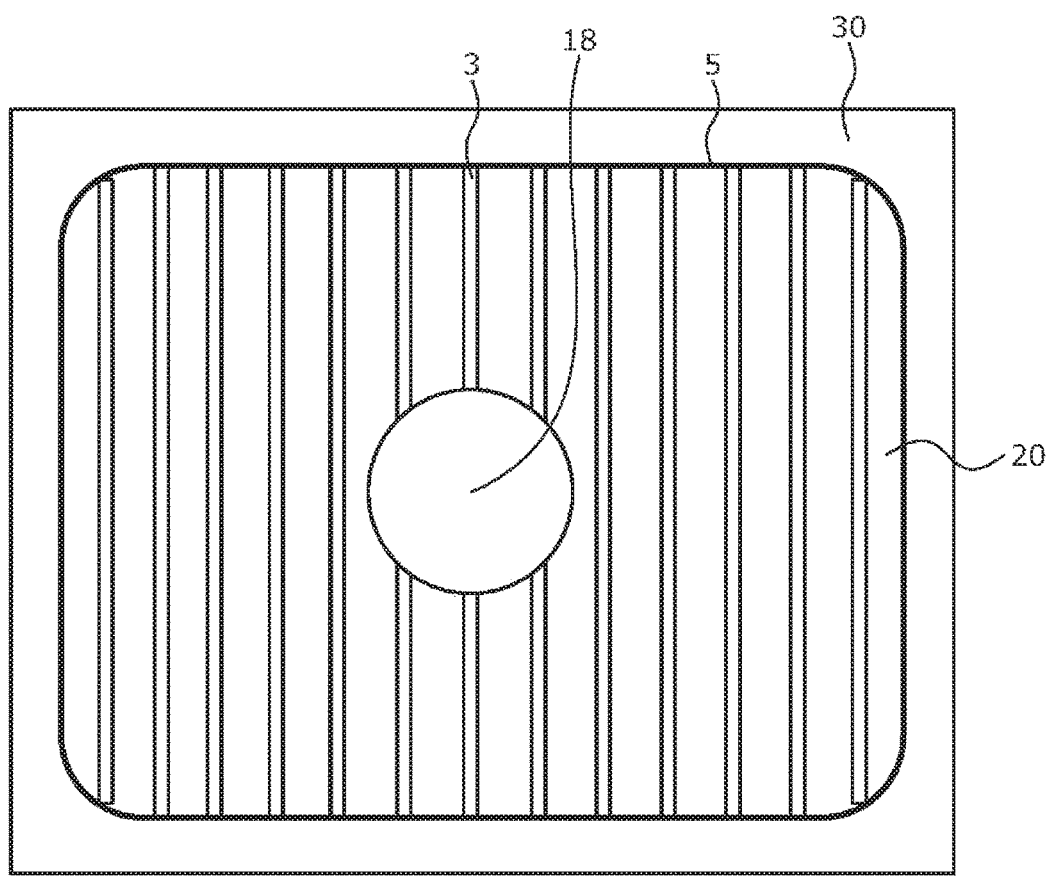
FIG. 3 is a top view of a trace of destruction by forward surge current of a silicon carbide diode having a conventional 600V, 1200V JBS structure.
Figure 4:
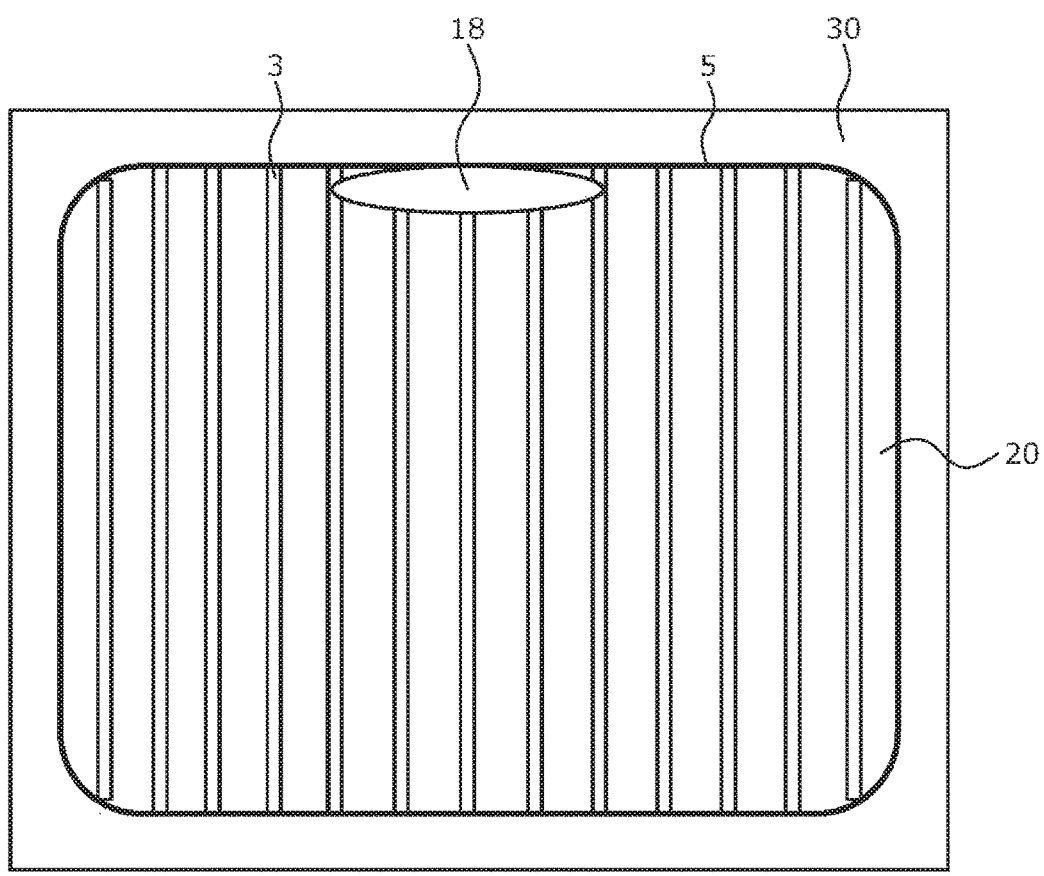
FIG. 4 is a top view of a trace of destruction by forward surge current of a silicon carbide diode having a conventional 1700V, 3300V JBS structure.

At the time of energization, naturally, the current density directly beneath the Al wire contact portion 17 becomes the highest. When surge current flows in an element of the structure depicted in FIG. 2 and forward surge withstand capability is measured, destruction marks are roughly divided as depicted in FIGS. 3 and 4. FIG. 3 is a top view of a trace of destruction by forward surge current of a silicon carbide diode having a conventional 600V, 1200V JBS structure. FIG. 4 is a top view of a trace of destruction by forward surge current of a silicon carbide diode having a conventional 1700V, 3300V JBS structure.

For the 600V, 1200V structure depicted in FIG. 3, a destruction mark 18 is observed at a portion having the highest current density, near a contact junction with an element substantially beneath the Al wire. It is thought that a preceding local temperature rise leads to penetration destruction near a center of the active region 20, near a high current region near a contact portion. On the other hand, for the 1700V or higher structure depicted in FIG. 4, the destruction mark 18 appears near the p$^+$-type guard ring region 5 on the outer periphery. In a 1700V or higher SiC SBD, the carrier concentration of the n$^-$-type drift layer 2 is $1 \times 10^{16}$/cm$^3$ or less to realize high voltage and accordingly, the barrier height is also relatively high. Therefore, before the Schottky electrode 9 and the n$^-$-type drift layer 2 are thermally destroyed by local current concentration at the surface of the n$^-$-type drift layer 2, movement progresses towards an outer periphery of the current concentration point consequent to resistance change accompanying temperature rise consequent to the energizing current to the Schottky electrode 9 and ultimately, current concentrates at the p$^+$-type guard ring region 5 on the outer periphery of the active region 20 having the highest concentration whereby thermal destruction occurs.

Figure 5:
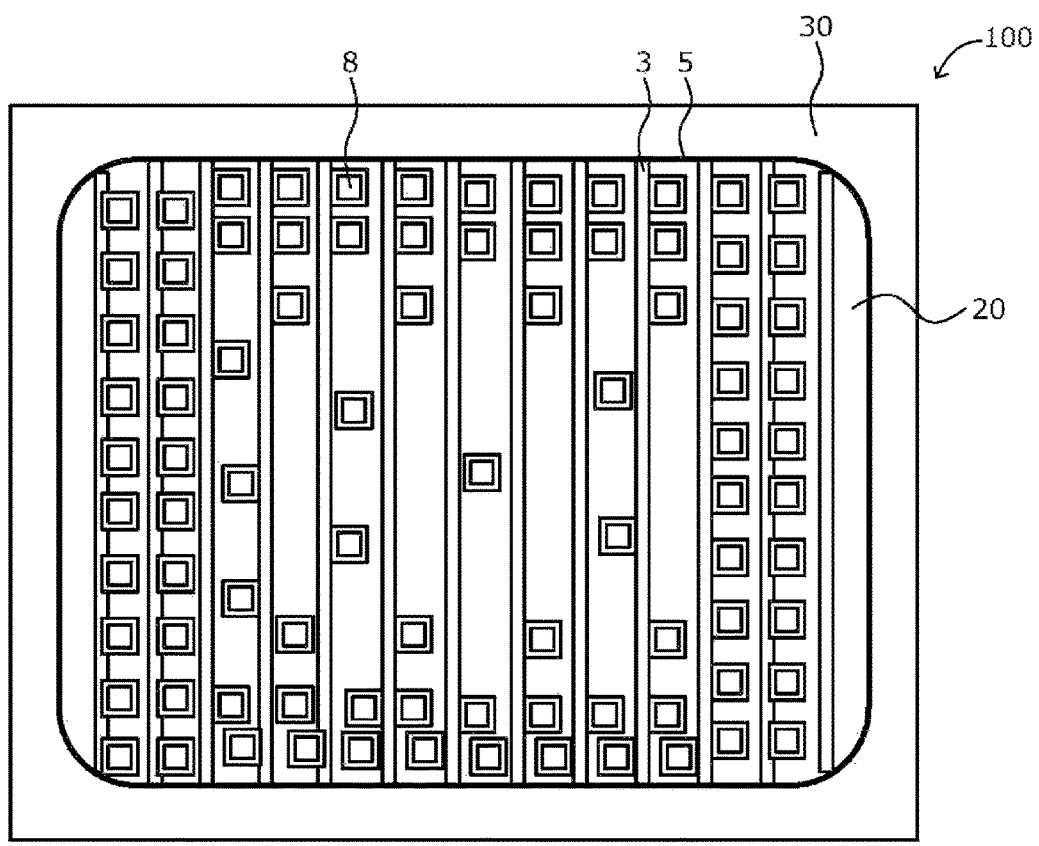
FIG. 5 is a top view of a structure of the silicon carbide semiconductor device according to the first embodiment.

Thus, in the first embodiment, a structure is proposed that reduces current concentration at the p$^+$-type guard ring region 5 of a 1700V or higher SiC SBD and prevents destruction at the p$^+$-type guard ring region 5. FIG. 5 is a top view of a structure of the silicon carbide semiconductor device 100 according to the first embodiment. The semiconductor device 100 depicted in FIG. 5 is a semiconductor chip. The base of the first embodiment is the structure depicted in FIG. 5. Depicted in FIG. 2, under a contact part (2 to 3 μm into a top of Al metal) toward the foundation (Al electrode) of the Al wire, the current density increases and by resistance change consequent to temperature rise, the current distribution moves toward the outer periphery. Accordingly, when the density of the ohmic electrodes 8 is increased from near the Al wire toward the outer periphery, surge current may be caused to flow uniformly in a plane.

Therefore, a basic structure of the first embodiment is a structure in which the density of the ohmic electrodes 8 in the chip 100 increases from the chip center toward the periphery (becoming highest near an outer periphery of the chip 100). For example, as depicted in FIG. 5, the ohmic electrodes 8 may be provided in a dot-shape and may be densely arranged, outwardly, in a plane.

In the present specification and claims, the density of the ohmic electrodes 8 refers to an area of the ohmic electrodes 8 per unit area of the chip 100 in a plan view. For example, in FIG. 5, an amount of area per square unit (such as square millimeter) of the chip 100 taken up by ohmic electrodes 8 is greater around a periphery of the active region 20 relative to a center of the active region 20. In other words, with reference to FIG. 5, the dot-shaped ohmic electrodes 8 are more densely spaced towards the periphery of the chip 100 than towards the center of the chip 100. Embodiments are not limited to any one unit area, but rather a density per any unit (such as millimeter, centimeter, etc.) area towards the periphery is greater than a density per the same unit area relative to the center of the chip 100.

Figure 6:
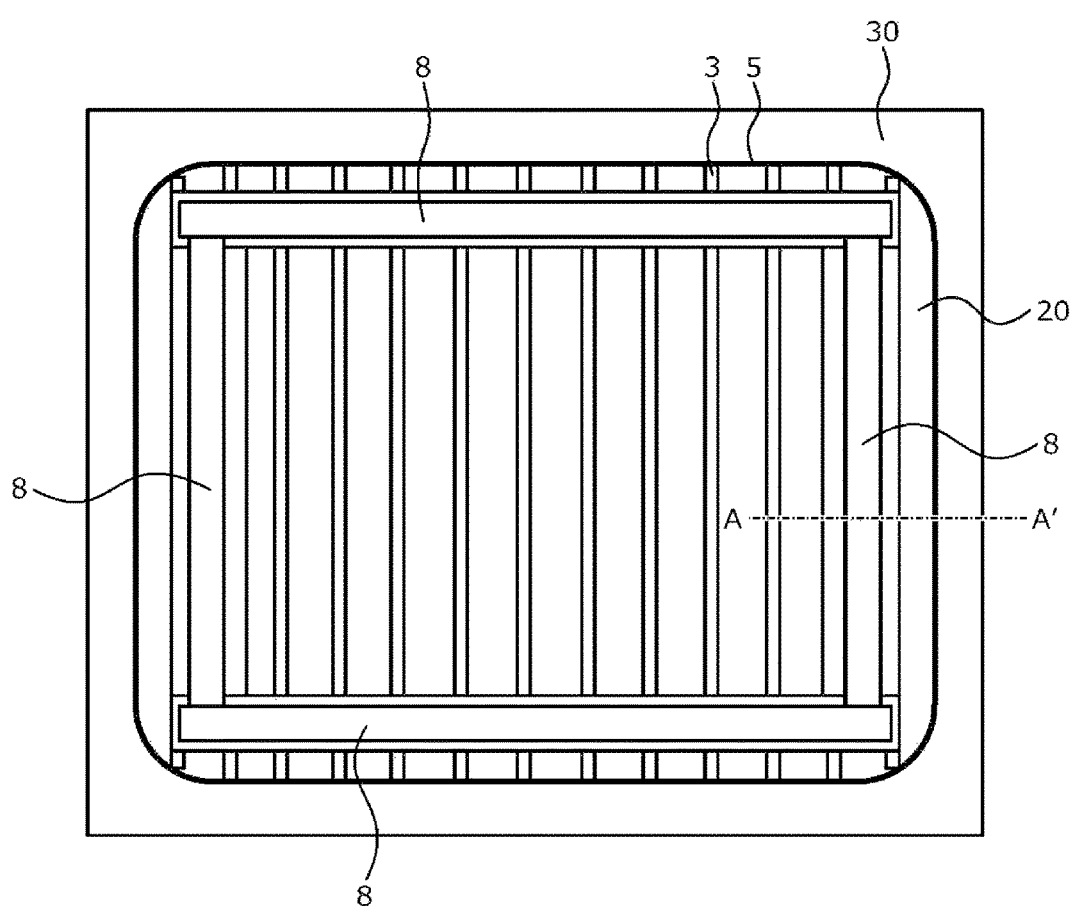
FIGS. 6 and 7 are top views of another structure of the silicon carbide semiconductor device according to the first embodiment.
Figure 7:
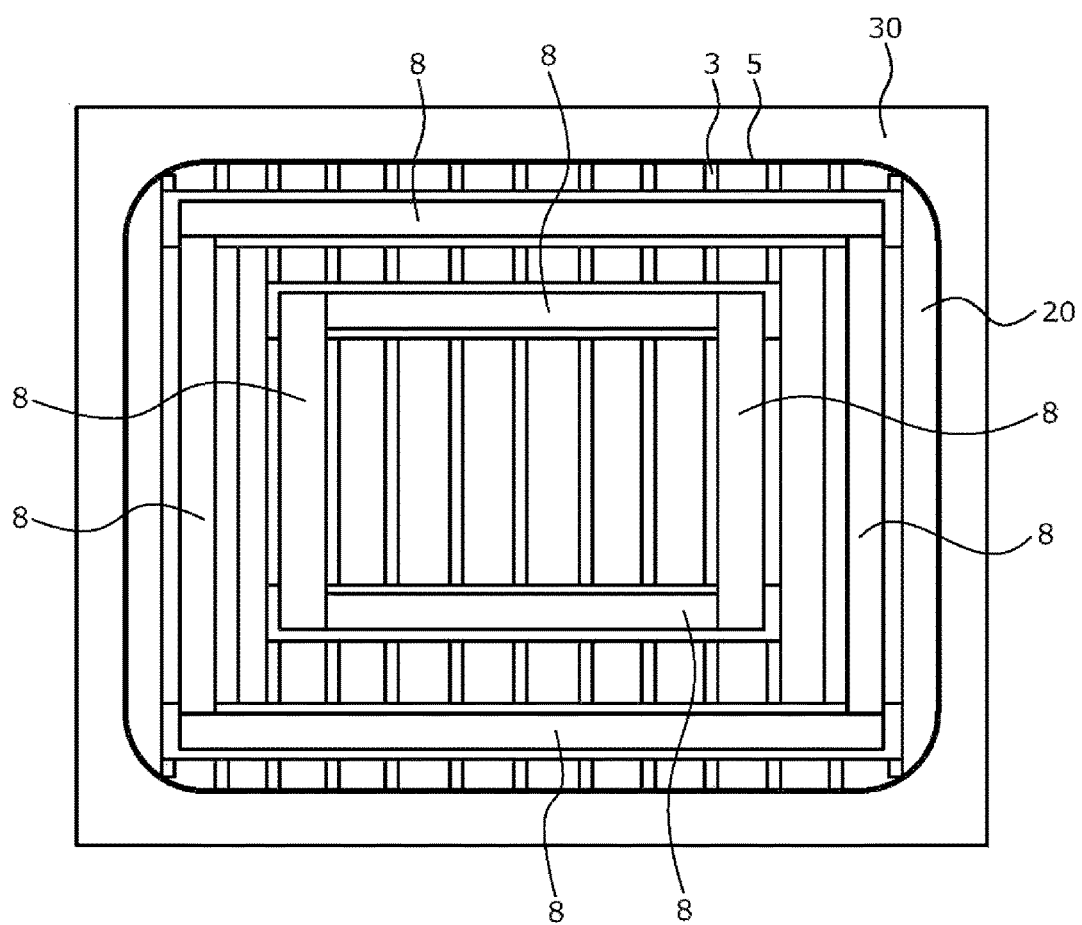

FIGS. 6 and 7 are top views of another structure of the silicon carbide semiconductor device according to the first embodiment. In practice, as depicted in FIGS. 6 and 7, on an inner side of the p$^+$-type guard ring region 5 most susceptible to destruction, an ohmic electrode 8 is provided whereby an increase of surge current may be realized. For example, as depicted in FIG. 6, at a chip outer peripheral portion near the p$^+$-type guard ring region 5, provision of the ohmic electrode 8 in a band shape is effective. After the p-type region 4 is formed on the inner side of the p$^+$-type guard ring region 5, the ohmic electrode 8 is formed therein. Here, the outer peripheral portion is a region surrounding a chip center portion, in particular, is a portion of the active region 20, near the edge termination region 30.

Further, as depicted in FIG. 7, according to the surface temperature distribution consequent to resistivity, etc. of the elements, the ohmic electrode 8 may be provided double-layered on the inner side of the p$^+$-type guard ring region 5. Here, in FIGS. 6 and 7, although the ohmic electrodes 8 are aligned without spaces between faces forming a contiguous structure, the ohmic electrode 8 may have an arbitrary dot-shape or striped shape to reduce forward voltage (VF).

Further, in FIGS. 6 and 7, although the ohmic electrode 8 is provided as a rectangular region, configuration is not limited hereto. Provided the contact resistance near the p$^+$-type guard ring region 5 is reduced and the temperature rise is decreased, embodiments of the invention include any shape or configuration of the ohmic electrodes 8. In addition, by providing an ohmic electrode 8 farther inward from the p$^+$-type guard ring region 5, the ohmic electrodes 8 at a suitable density such that the spread of current or temperature rise to the outer peripheral portion is not stopped, surge capability is further enhanced. In the end, as depicted in FIG. 5, a structure in which distribution of the ohmic electrodes 8 is denser from near a center toward the outer periphery and current flows in the entire plane of the active region 20 by the ohmic electrodes 8 is ideal. Although the arrangement of the ohmic electrode 8 described above is in a case of wire bonding near a chip center as depicted in FIG. 2 and the insertion method of the ohmic electrodes 8 differs according to the Al wire positions and the number thereof, the ohmic electrodes 8 being sparse near the Al wire and being dense at the outer periphery does not change.

A contact metal of a material of the ohmic electrode 8 is heat treated at about 1000 degrees C. and formed using a material containing Ni—Al—Ti, or Ni—Al, or Ni easily forming an ohmic contact with a p-type SiC. In the first embodiment, no destruction mark such as that depicted in FIG. 4 occurs because local concentration of surge current does not easily occur.

In FIGS. 6 and 7, although the contact metal is formed on the entire surface, the contact metal may be formed as a set of dot-shapes or a set of stripes. In this case, an interval of the p-type well region 3 beneath the dots or the stripes must not be wide. If the interval is wide, destruction occur from the local concentration of current at this Schottky junction portion. Empirically, although this width is about 1 to 2 μm, the value differs according to the impurity concentration of the n-type drift layer 2 and the impurity concentration of the p-type well region 3. Although there is a technique of significantly narrowing the interval of the p-type well regions 3 to further increase the surge current, in this case, there is concern of process limitations or VF rising.

The method of manufacturing a silicon carbide semiconductor device according to the first embodiment will be described. Here, the method of manufacturing the silicon carbide semiconductor device depicted in FIGS. 1 and 6 will be described. FIGS. 8, 9, 10, 11, 12, 13, and 14 are cross-sectional views of the silicon carbide semiconductor device during manufacture according to the present embodiment. First, the n-type silicon carbide substrate 1 is prepared. Next, on the front surface of the n-type silicon carbide substrate 1, the n-type drift layer 2 is formed by epitaxial growth.

Next, in the active region 20, by photolithography and ion implantation of a p-type impurity, the p-type well region 3 and the p-type region 4 are selectively formed in the surface layer of the n$^-$-type drift layer 2. For example, the depth of the p-type well region 3 is about 0.8 μm. Next, in the edge termination region 30, by photolithography and ion implantation of a p-type impurity, the p$^+$-type guard ring region 5 and the JTE region 6 are selectively formed in the surface layer of the n$^-$-type drift layer 2. The sequence of the formation of the p-type well region 3 and the p-type region 4, and the p$^+$-type guard ring region 5 and the JTE region 6 may be reversed. After all implantations have been completed, activation annealing is performed.

Figure 8:
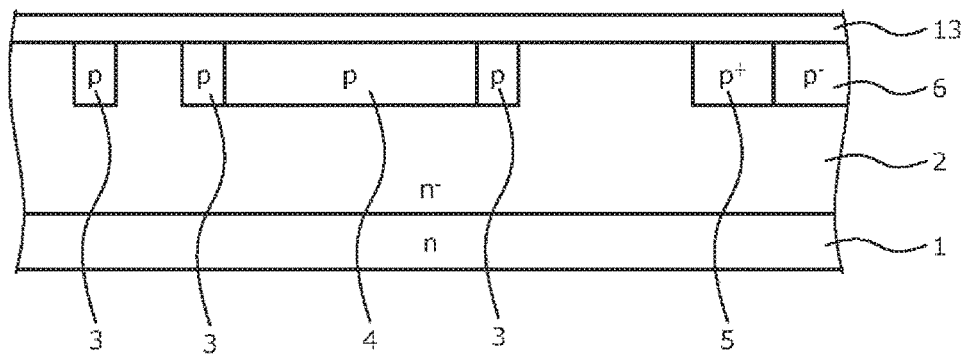
FIGS. 8, 9, 10, 11, 12, 13, and 14 are cross-sectional views of the silicon carbide semiconductor device during manufacture according to the first embodiment.
Figure 9:
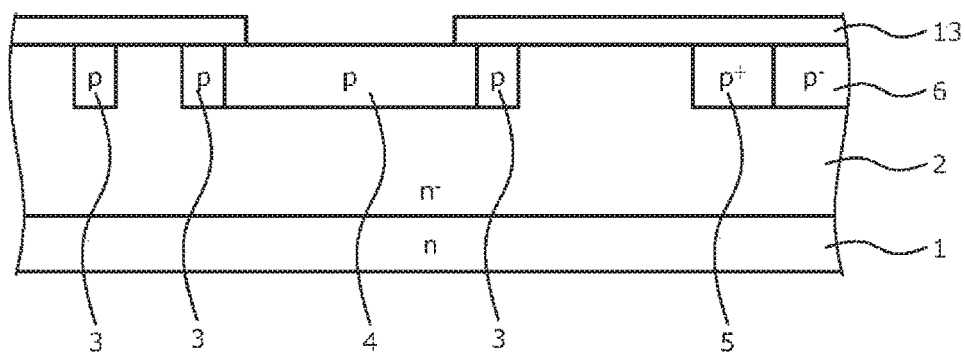

Next, along the front surface of the silicon carbide base, a field oxide film 13 having, for example, a thickness of 0.5 μm is formed. The state up to here is depicted in FIG. 8. Next, on the p-type region 4, a contact metal formation region is oxide-film-etched by a photoetching process. The state up to here is depicted in FIG. 9.

Figure 10:
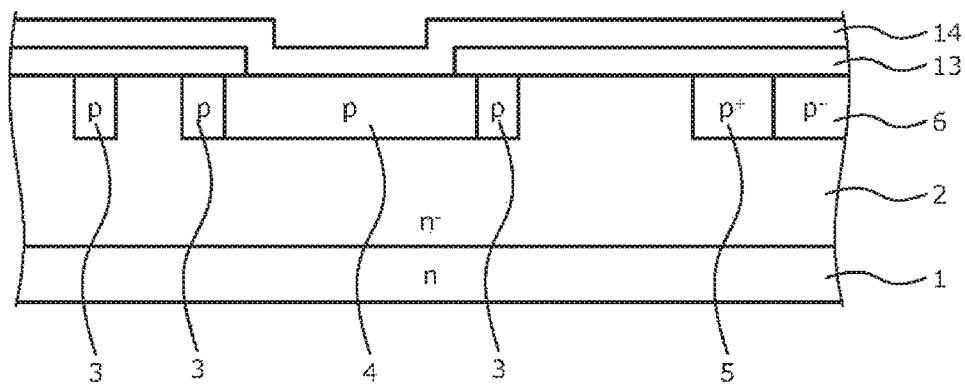
Figure 11:
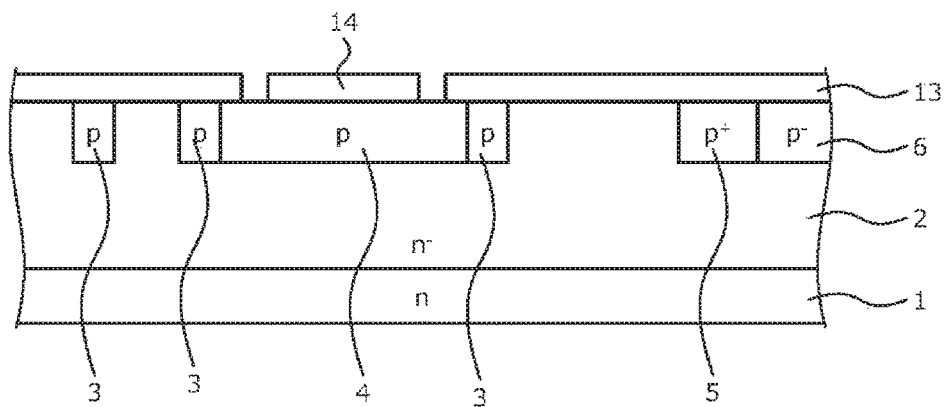

Next, along the front surface of the silicon carbide base, Ni having a thickness of 60 nm is formed as a contact metal 14 by a sputtering process. The state up to here is depicted in FIG. 10. Next, on the p-type region 4, the contact metal 14 is removed by etching, leaving a region forming the ohmic electrode 8. The state up to here is depicted in FIG. 11.

Figure 12:
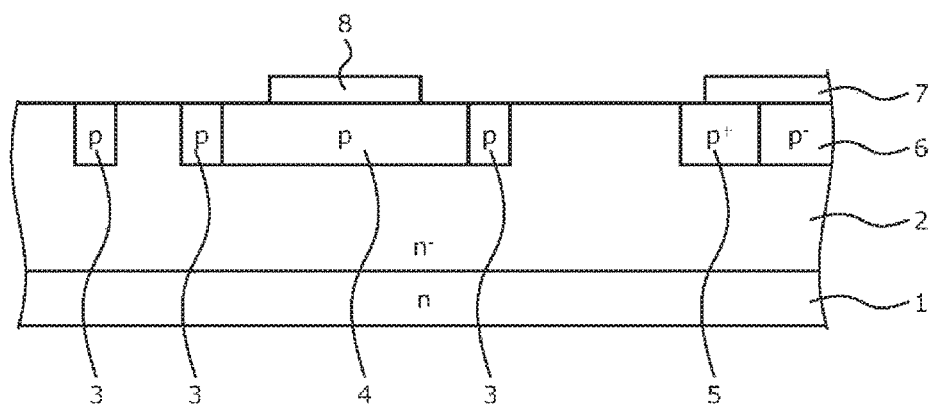

Next, the ohmic electrode 8 is formed by a sintering process of 5 minutes at 1000 degrees C. Next, the field oxide film 13 is removed by etching, leaving a portion in the edge termination region 30. The field oxide film 13 left in the edge termination region 30 becomes the interlayer insulating film 7. The state up to here is depicted in FIG. 12.

Figure 13:
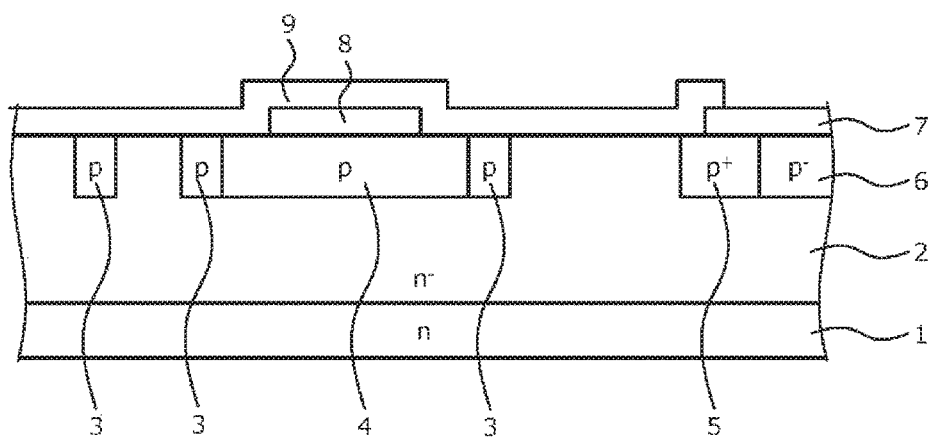

Next, along the front surface of the silicon carbide base, a Ti film having a thickness of 0.5 μm is formed by a sputtering method as a Schottky metal and an outside portion from the p$^+$-type guard ring region 5 is removed by etching, forming the Schottky electrode 9. The state up to here is depicted in FIG. 13.

Figure 14:
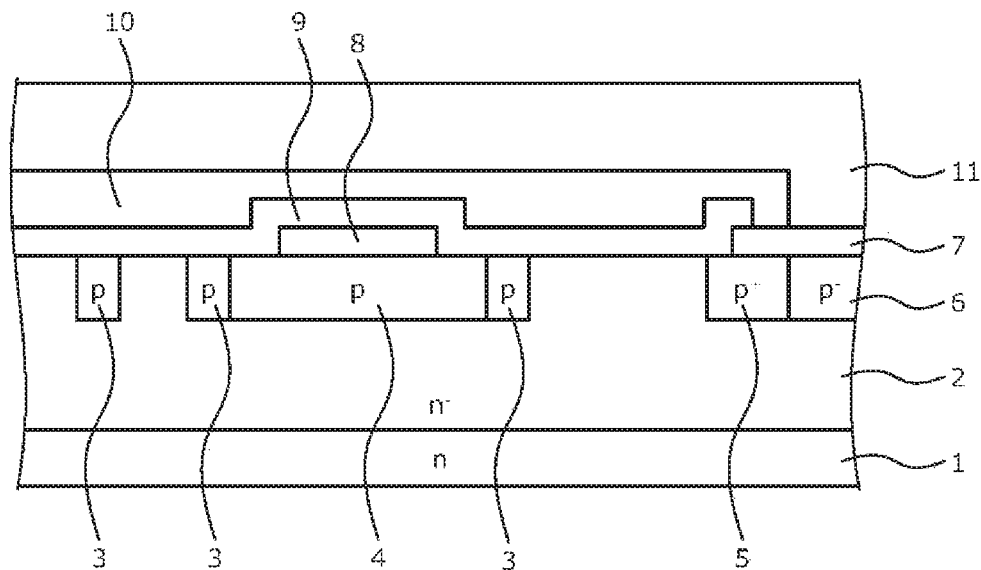

Next, Al—Si having a thickness of 5 μm is formed as the upper electrode 10 and is removed on the p$^+$-type guard ring region 5 on the outer peripheral side of the Schottky electrode 9 by etching. Next, on the uppermost surface, polyimide is applied, forming the passivation film 11. The state up to here is depicted in FIG. 14.

Finally, on the rear surface of the n-type silicon carbide substrate 1, the lower electrode 12 is formed. Thus, the semiconductor device depicted in FIGS. 1 and 6 is manufactured.

Figure 15:
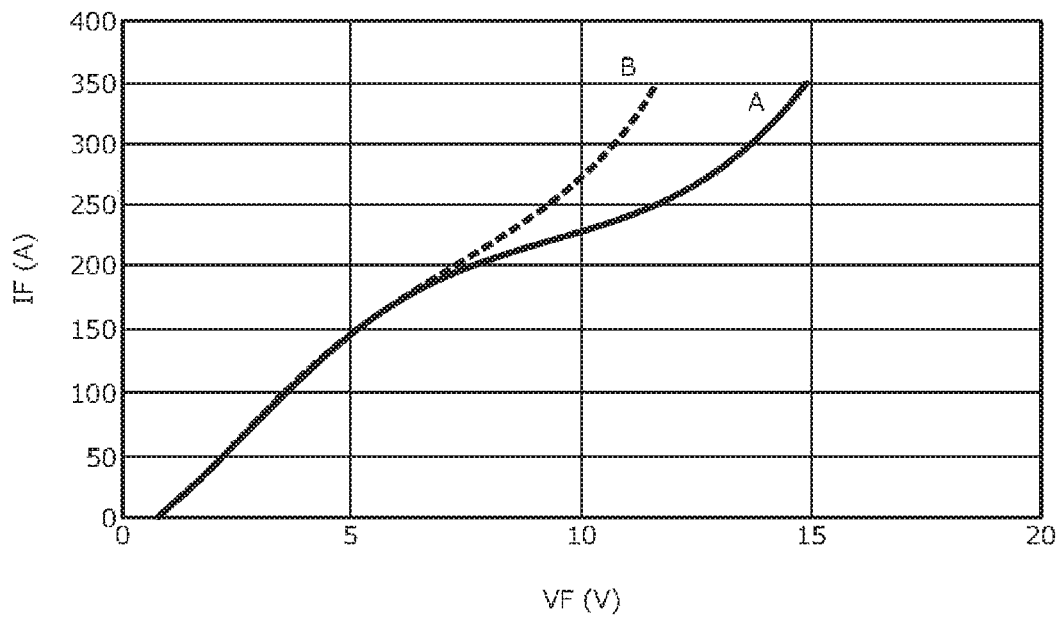
FIG. 15 is a graph comparing forward characteristics of the silicon carbide semiconductor device according to the first embodiment.
Figure 28:
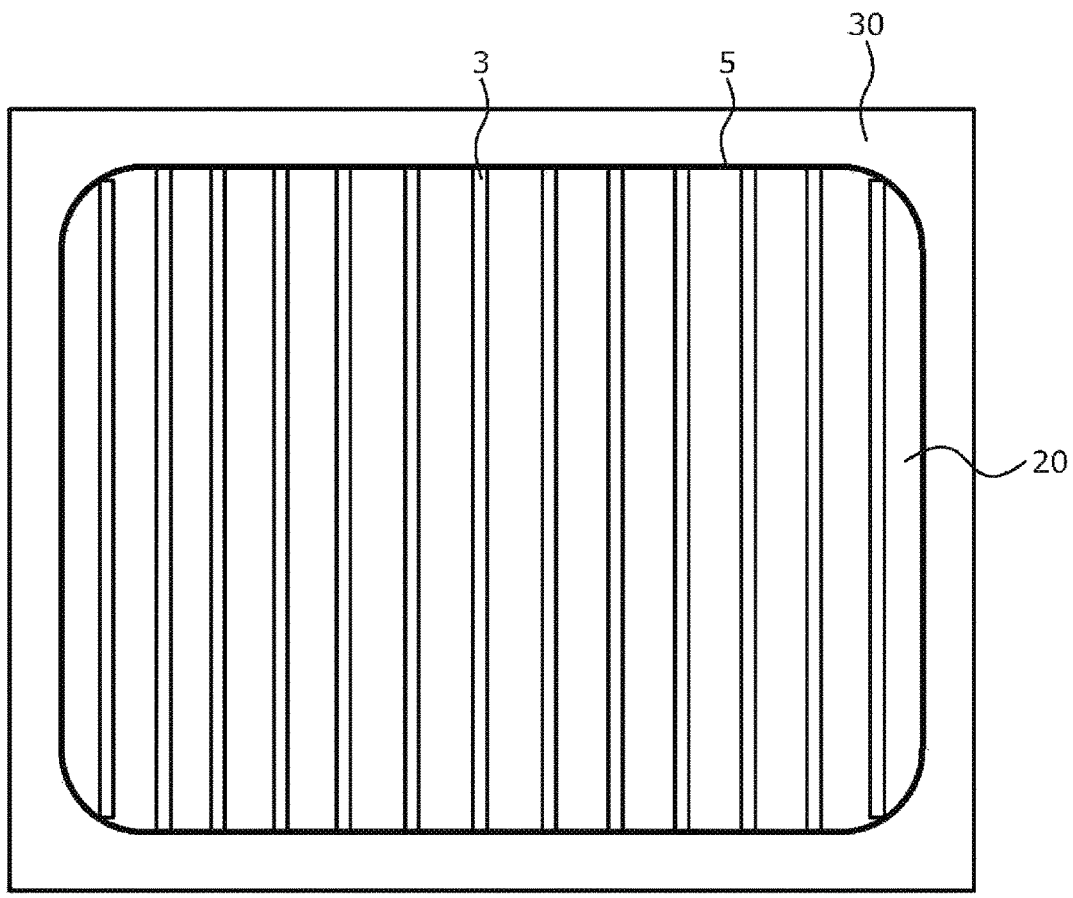
FIG. 28 is a top view of a structure of a silicon carbide diode having a conventional JBS structure.

FIG. 15 is a graph comparing forward characteristics of the silicon carbide semiconductor device according to the first embodiment. In FIG. 15, the vertical axis represents forward current, the unit is A; and the horizontal axis represents forward voltage, the unit is V. Further, a curve A in FIG. 15 represents characteristics of a silicon carbide diode having the conventional JBS structure depicted in FIG. 28, and a curve B in FIG. 15 represents characteristics of the silicon carbide diode according to the first embodiment in FIG. 6.

The curves A and B in FIG. 15 are curves of a composite of the current flowing in the Schottky electrode 9 and the p-type well region 3. The curve B including the current flowing in the ohmic electrode 8 has a lower rising voltage on the high current side. By optimizing the spread of the current through the ohmic electrodes 8, the rising waveform of the curve B may be further shifted to the constant voltage side. By reducing the rising voltage, a large power of current×voltage may be applied and the forward surge capability becomes increased.

As described above, according to the silicon carbide semiconductor device of the first embodiment, the ohmic electrode density in the chip increases from the chip center toward the outer periphery. Although current density increases in the contact part to the foundation of the Al wire and the current distribution moves toward the outer periphery by resistance change consequent to temperature rise, the ohmic electrode density increases from the chip center toward the periphery whereby surge current may uniformly flow in a plane. Therefore, an increase of forward surge current of a 1700V or higher silicon carbide semiconductor device may be realized.

Figure 16:
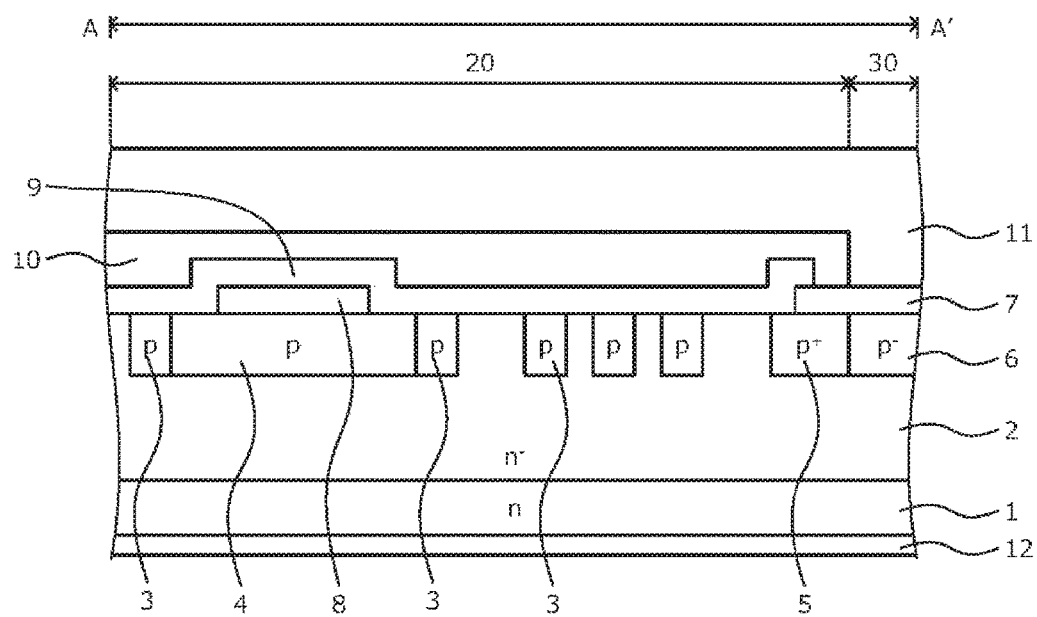
FIG. 16 is a cross-sectional view of a structure of the silicon carbide semiconductor device according to a second embodiment, along cutting line A-A' in FIG. 18.

A structure of the silicon carbide semiconductor device according to a second embodiment will be described. FIG. 16 is a cross-sectional view of a structure of the silicon carbide semiconductor device according to the second embodiment, along cutting line A-A' in FIG. 18. The cross-section of the semiconductor device according to the second embodiment depicted in FIG. 16 differs from that of the semiconductor device according to the first embodiment depicted in FIG. 1 in that between the p-type region 4 and the p$^+$-type guard ring region 5, the p-type well region 3 is provided in plural because the p-type region 4 of the second embodiment is provided at the chip center.

Figure 17:
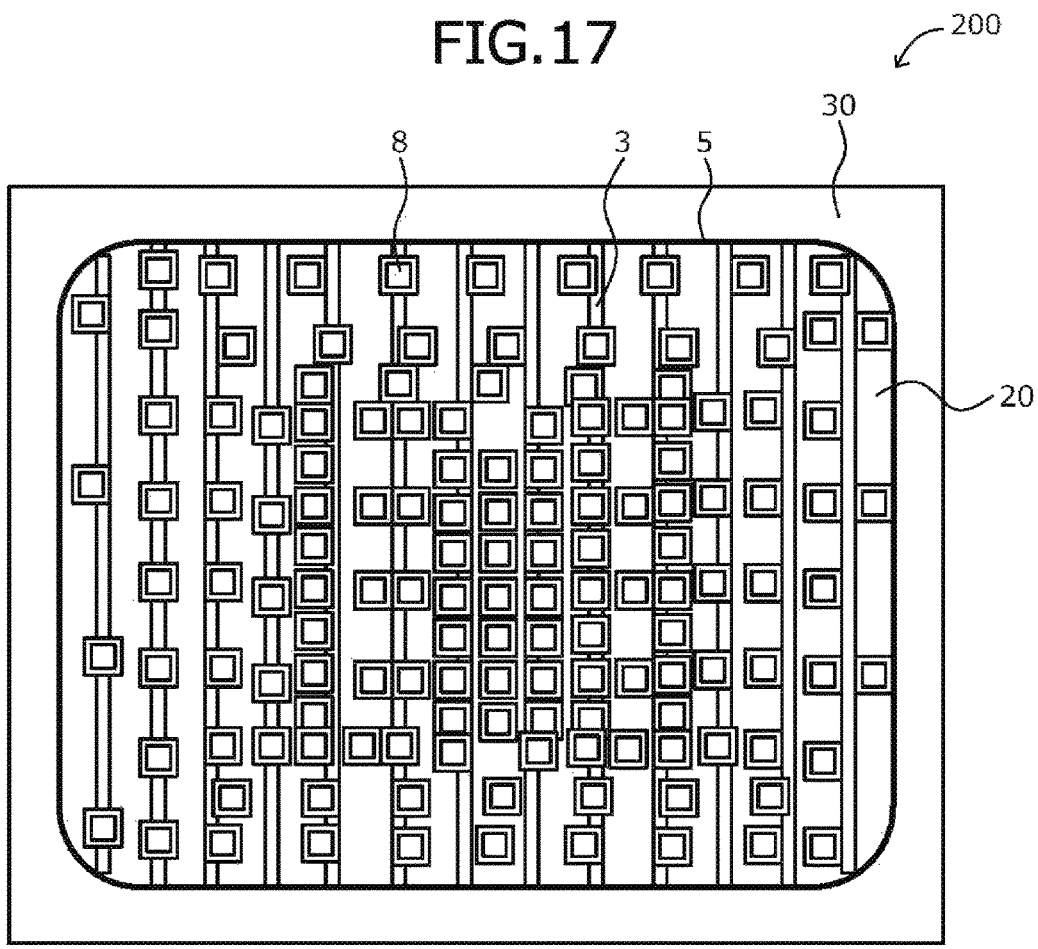
FIG. 17 is a top view of a structure of the silicon carbide semiconductor device according to the second embodiment.

As described above, for 600V, 1200V structures, the destruction mark 18 is observed at a portion where the current density is highest near a junction portion with the element substantially directly beneath the Al wire. Thus, in the second embodiment, a structure is proposed that reduces current concentration near the junction portion with the element directly beneath the Al wire of a 600V, 1200V SiC SBD. Therefore, in the second embodiment, as a basic structure, a structure is adopted in which the density of the ohmic electrodes 8 in the chip decreases from the chip center toward the outer periphery (highest at the chip center). FIG. 17 is a top view of a structure of the silicon carbide semiconductor device according to the second embodiment. In particular, as depicted in FIG. 17, the ohmic electrode 8 may be provided having a dot-shape and may be provided in a plane, sparsely toward the outside.

For example, in FIG. 17, an amount of area per square unit (such as square millimeter) of the chip 100 taken up by ohmic electrodes 8 is greater towards the center of the active region than towards the periphery of the active region 20. In other words, with reference to FIG. 17, the dot-shaped ohmic electrodes 8 are more densely spaced towards the center of the chip 200 than towards the periphery of the chip 100.

Figure 18:
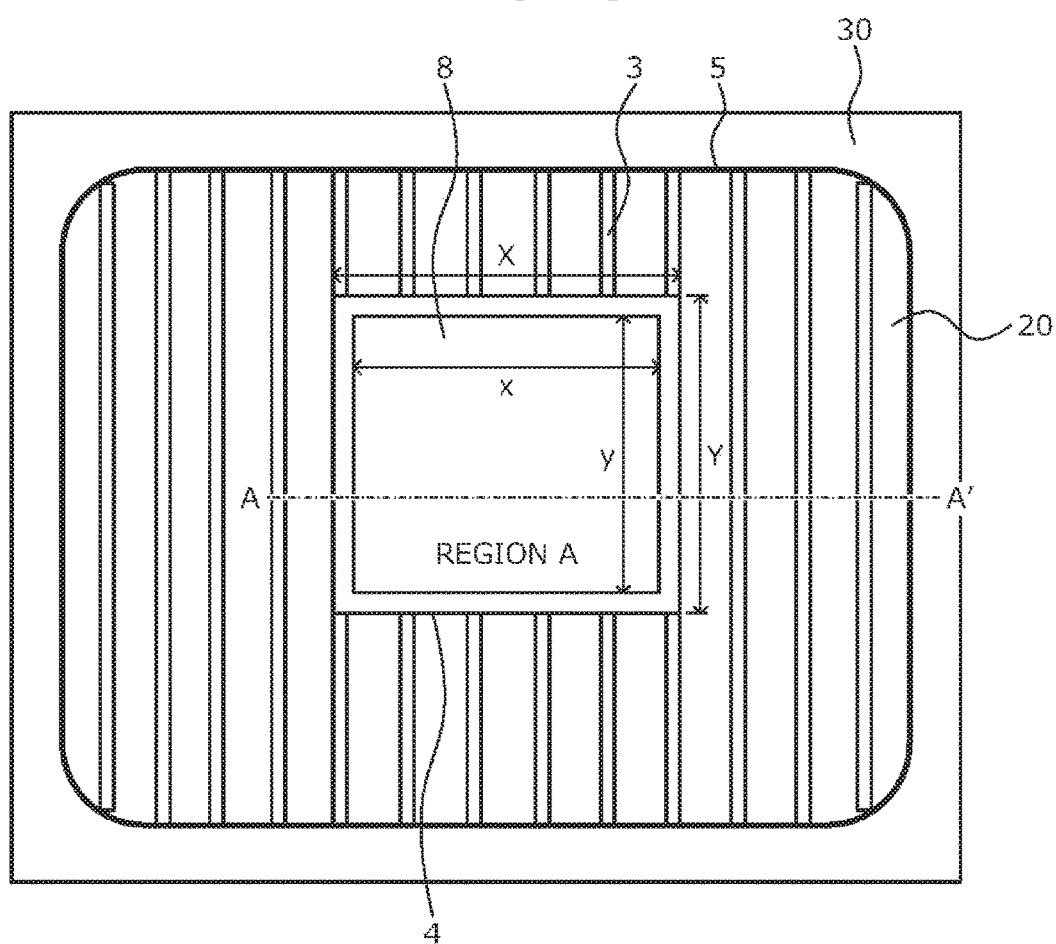
FIGS. 18, 19, 20, 21, 22, and 23 are top views of other structures of the silicon carbide semiconductor device according to the second embodiment.

FIGS. 18, 19, 20, 21, 22, and 23 are top views of other structures of the silicon carbide semiconductor device according to the second embodiment. For example, FIG. 18 is a top view of another structure of the silicon carbide semiconductor device according to the second embodiment. As depicted in FIG. 18, a configuration is assumed in which the contact resistance near a contact portion with the element of the Al wire most susceptible to destruction is lowered and a region A of the p-type region 4 of a size X×Y is provided. In FIG. 18, configuration is that in which after the p-type region 4 of the size X×Y is formed, the ohmic electrode 8 of a size x×y is formed therein. The position of the region A may fix a position in the chip by a formation of the wire bonding pad on the chip surface. In FIG. 18, although the entire region of the size x×y constitutes the ohmic electrode 8, the configuration is not limited hereto.

Figure 19:
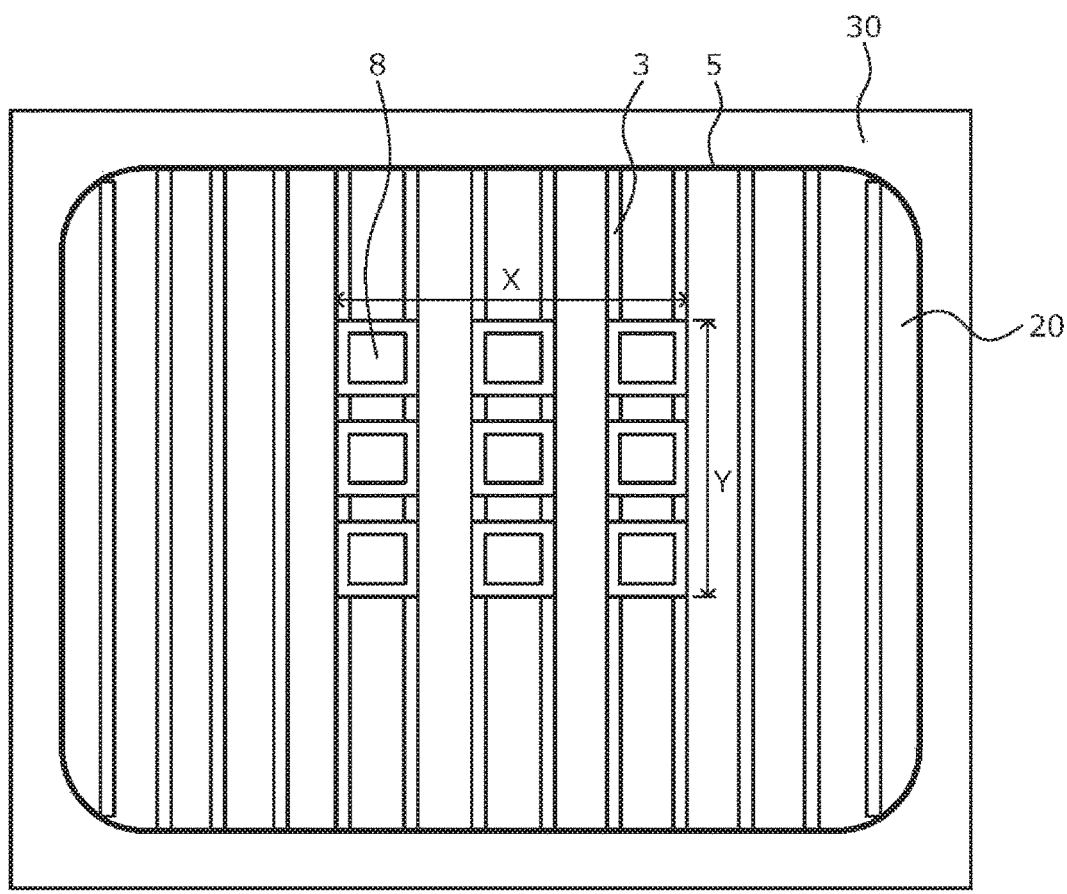
Figure 20:
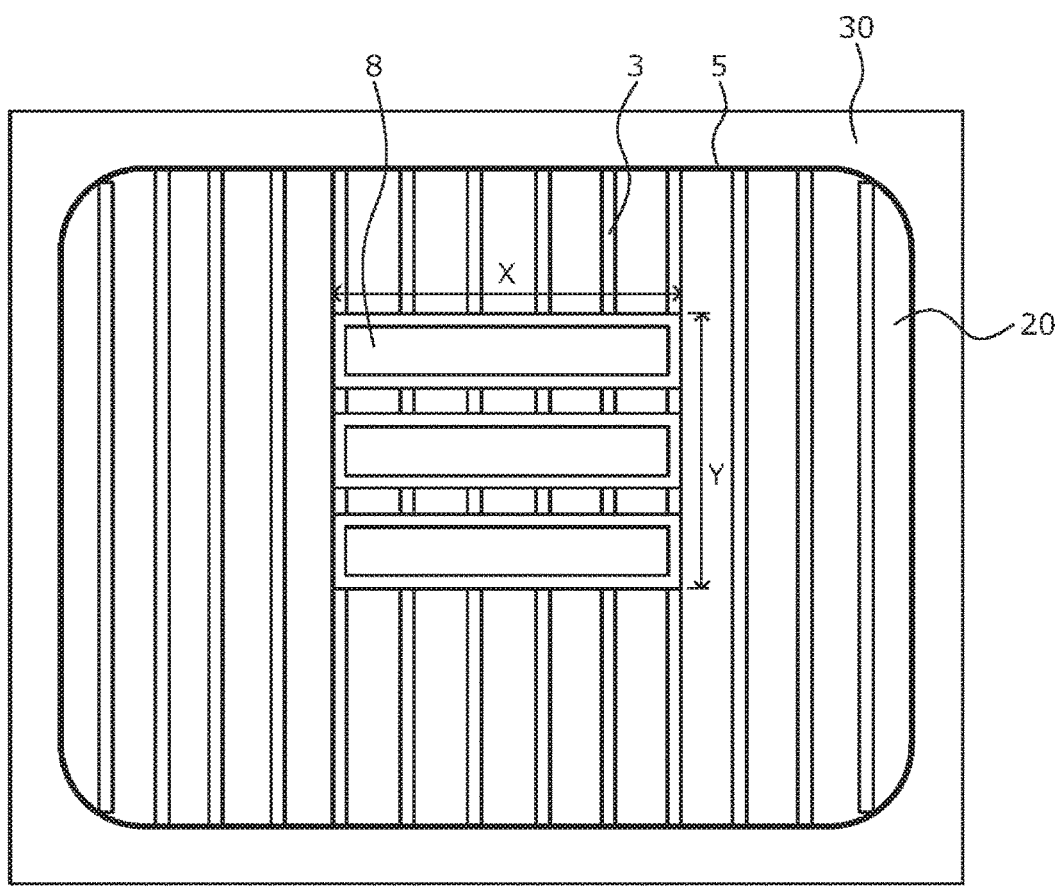

For example, in a region of the size X×Y such as that depicted in FIGS. 19 and 20, a set of dot-shapes as depicted in FIG. 19 or a set of stripes as depicted in FIG. 20 may be provided. In this case, the p-type well region 3 has to be provided for each of the ohmic electrodes 8. However, compared to FIG. 18, the area of the Schottky electrode 9 may be increased and a low VF may be set. Further, the interval of the p-type well regions 3 beneath each of the dots or stripes must not be made wide. If made wide, destruction occurs consequent to local concentration of current at this Schottky junction portion. Although this width is about 1 to 2 μm, the value differs according to the impurity concentration of the n$^-$-type drift layer 2 and the impurity concentration of the p-type well region 3. Further, in FIGS. 18 to 20, although a rectangular region of the size X×Y is considered, the shape is not limited hereto provided the wire junction region is included.

Here, a basis of the second embodiment is the structure depicted in FIG. 18. In this structure, the region A of the p-type region of the size X×Y includes deviation and the contact part to the foundation of the Al wire depicted in FIG. 2. Naturally, the ohmic electrode 8 is produced by forming on the wide p-type region 4, a contact metal of a material of the ohmic electrode 8. In this case, the size of the ohmic electrode 8 is x×y. The contact metal is formed by heat treatment at about 1000 degrees C., using a material containing Ni—Al—Ti, or Ni—Al, or Ni easily forming an ohmic contact with a p-type SiC.

For example, in a case in which the region A is formed including deviation and the contact part to the foundation of the Al wire of 500 μmφ, X×Y is 1 mm×1 mm. By forming the ohmic electrode 8 of the size x×y in the region A, the destruction mark 18 penetrating the SiC as that depicted in FIG. 3 does not occur because local concentration of surge current does not easily occur.

Although the region A for preventing destruction beneath the Al wire has been described to be formed by a contiguous configuration of faces, a dot configuration, or a stripe configuration, other than these, configuration may be an inner shape dot or a ring shape provided local concentration of current beneath the Al wire is prevented. In FIGS. 18 to 20, a majority of the current concentrates only in the region A. Although the interval of the p-type well region 3 may be significantly narrowed to further increase forward surge current, in this case, there is concern of process limitations or VF rising.

Figure 21:
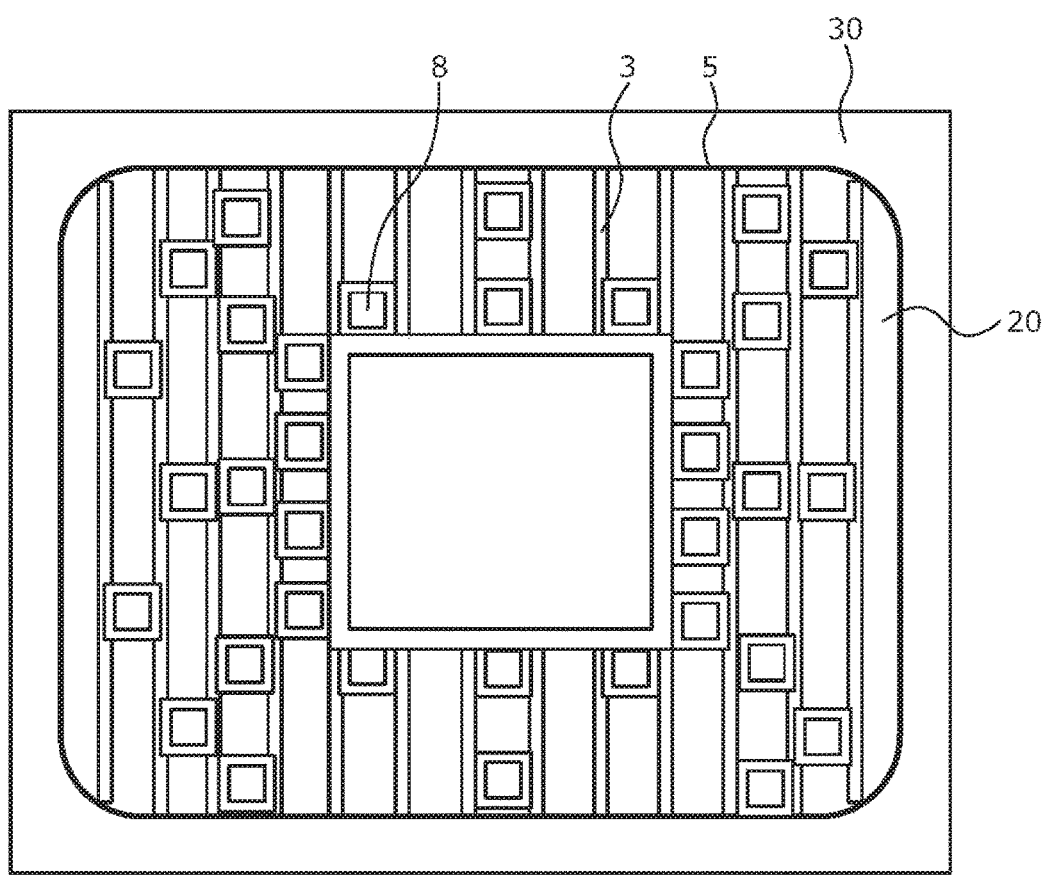
Figure 22:
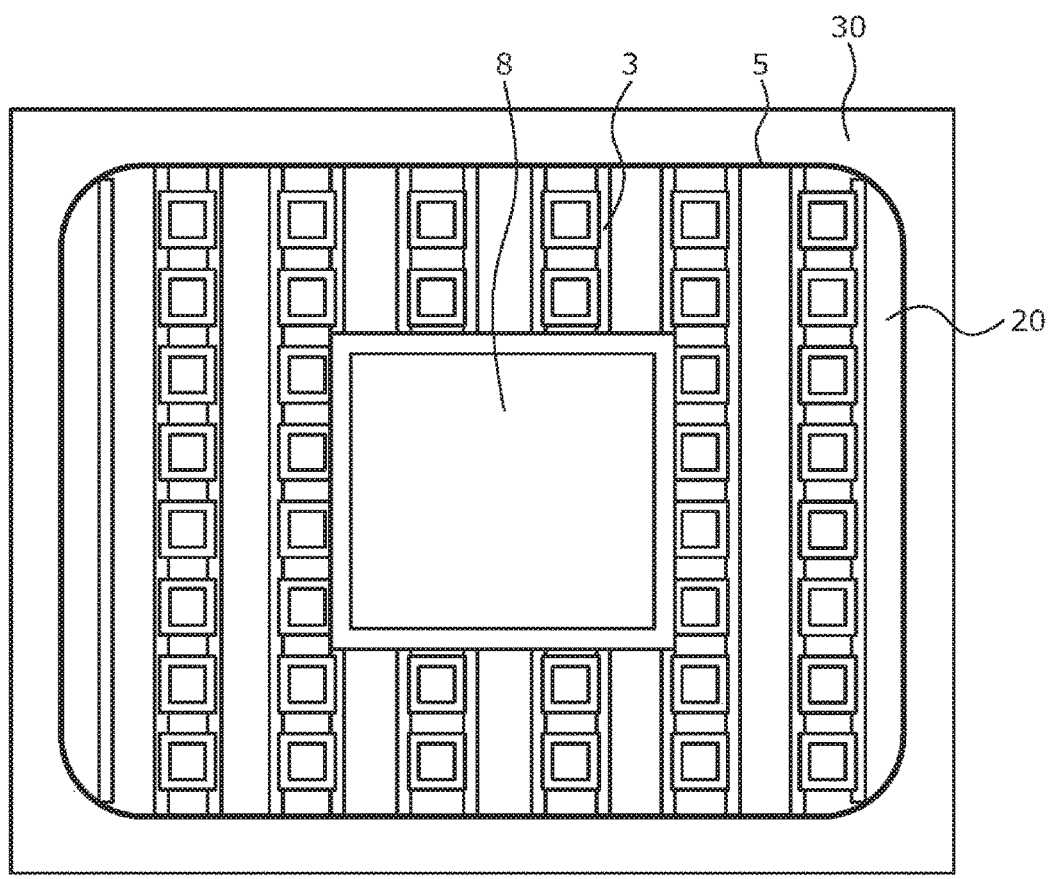

Thus, a technique of forming the ohmic electrode 8 along a chip inner-outer peripheral direction of the region A is shown. A purpose of this is to widen a surge current energization region in an outer peripheral direction from the region A. In FIG. 21, the ohmic electrode 8 of a dot-shape is formed in a portion other than the region A. Since the spread of current is toward the outside, configuration is such that near the outer periphery of the region A, dots are dense and become sparse towards the outer periphery. FIG. 22 depicts a configuration in which the dot region depicted in FIG. 21 is formed having a uniform density (for example, the density in the outer peripheral portion of the region A in FIG. 21). Configurations depicted in FIGS. 21 and 22 are arbitrarily determined by a tradeoff of VF and the region in which current spreads (this correlates to forward surge current).

Figure 23:
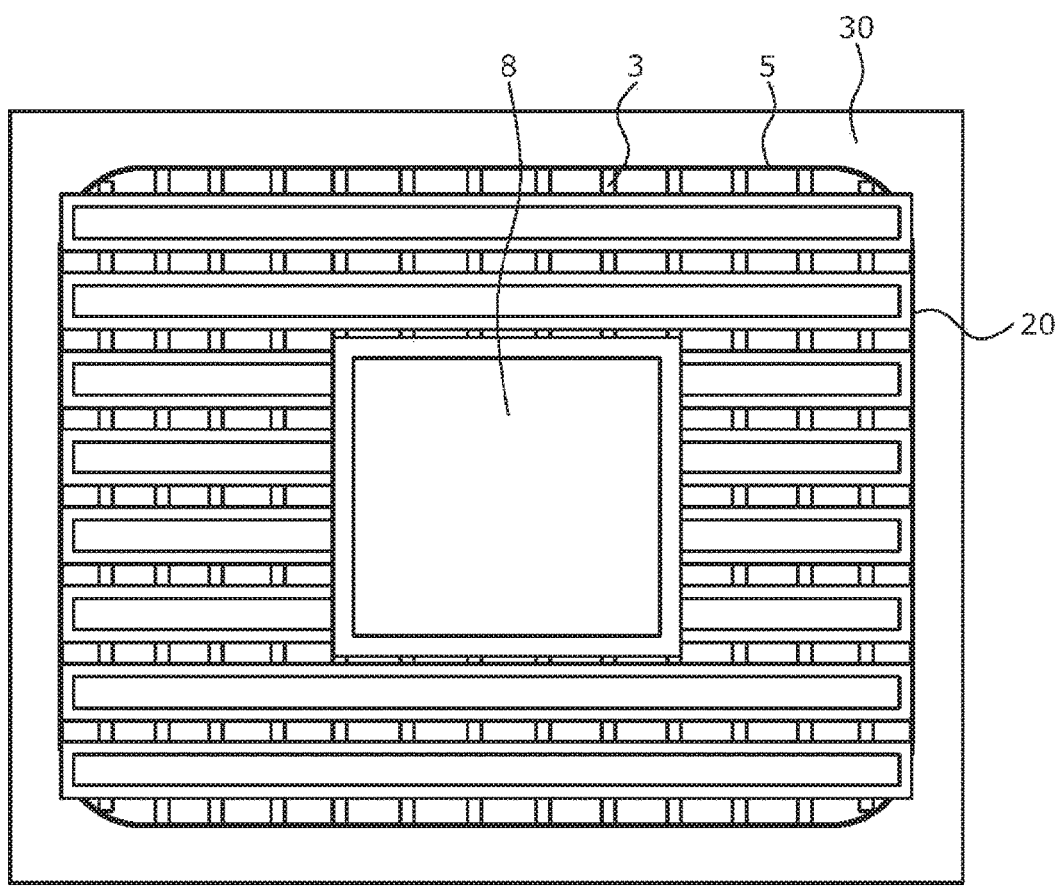

FIG. 23 is an example of insertion of the ohmic electrode 8 having a striped shape into a region other than the region A. In this figure, although a constant interval is depicted, in view of VF rises, it is realistic to assume dense arrangement near the region A and spare arrangement outwardly. In particular, the stripes of the ohmic electrode 8 may be formed orthogonal to the p-type well region 3. The reason for this is that since the surface electric field strength (related to leak current) is determined by the width and interval of the p-type well regions 3, with respect to the ohmic electrode 8 that is wide, the Schottky electrode 9 portion becomes wide and the destruction rate at this portion increases.

Figure 24:
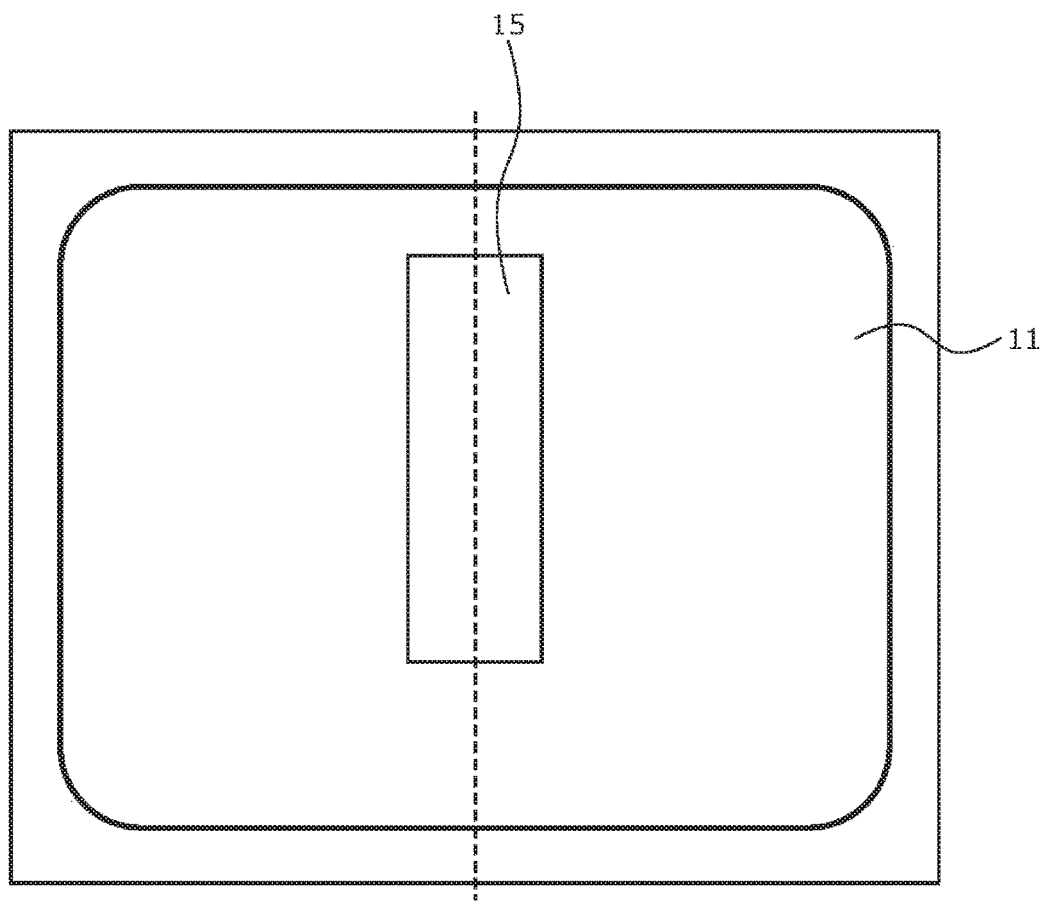
FIG. 24 is a top view of a bonding pad of the silicon carbide semiconductor device according to the second embodiment.
Figure 25:
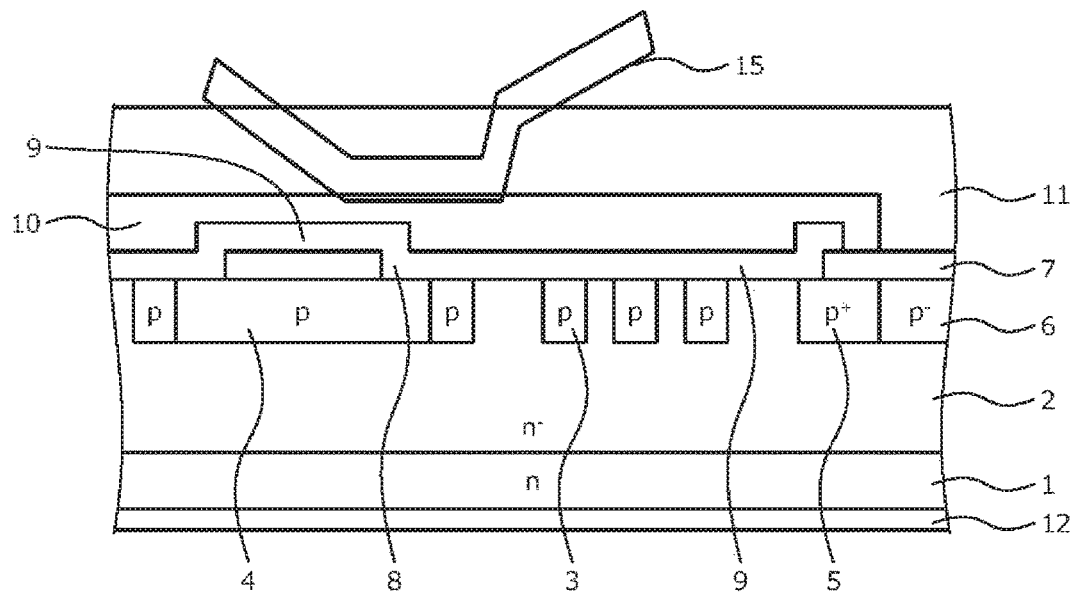
FIG. 25 is a cross-sectional view including an Al wire of the silicon carbide semiconductor device according to the second embodiment.

FIG. 24 is a top view of a bonding pad of the silicon carbide semiconductor device according to the second embodiment. The position of the Al wire has to be fixed in order for current to stably flow in the region A. Accordingly, as depicted in FIG. 24, the bonding pad is formed using a polyimide. FIG. 25 is a cross-sectional view including the Al wire of the silicon carbide semiconductor device according to the second embodiment. Typically, an Al wire 15 penetrates about 2 to 3 μm into the Al metal of the upper electrode 10. Naturally, current concentrates most at the ohmic electrode 8 of the center.

The method of manufacturing the semiconductor device according to the second embodiment differs from the first embodiment only in the location where the ohmic electrodes 8 are formed, description of other portions identical to the method of manufacturing the semiconductor device according to the first embodiment are omitted hereinafter.

Figure 26:
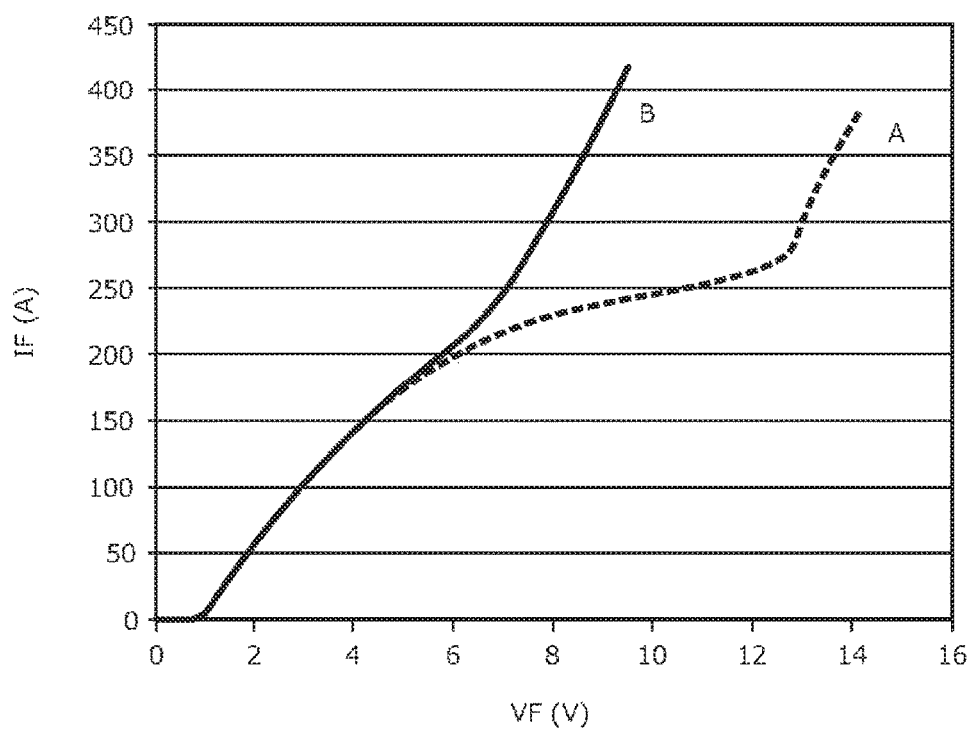
FIG. 26 is a graph comparing forward characteristics of the silicon carbide semiconductor device according to the second embodiment.
Figure 27:
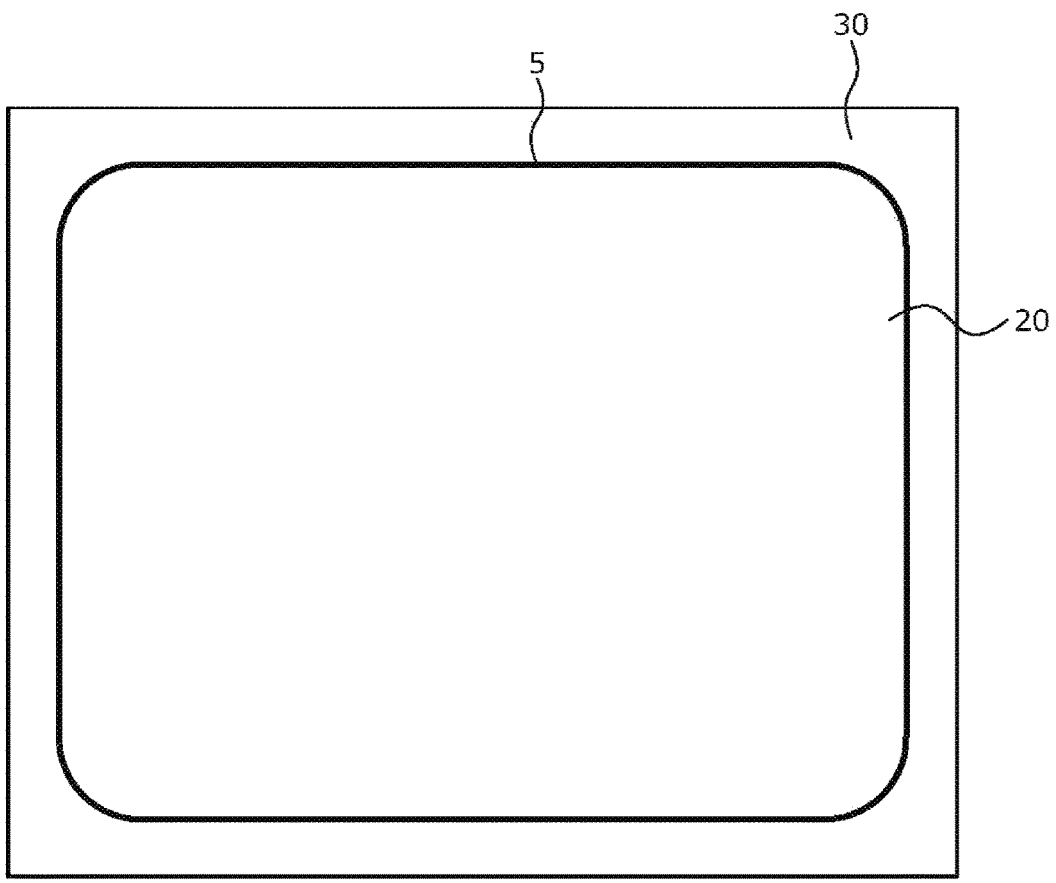
FIG. 27 is a top view of a structure of a conventional silicon carbide diode.

FIG. 26 is a graph comparing forward characteristics of the silicon carbide semiconductor device according to the second embodiment. In FIG. 26, the vertical axis represents forward current, the unit is A; and the horizontal axis represents forward voltage, the unit is V. Further, a curve A in FIG. 26 represents characteristics of a silicon carbide diode having the conventional JBS structure depicted in FIG. 27; and curve B in FIG. 26 represents characteristics of a silicon carbide diode according to the second embodiment depicted in FIG. 21.

The curves A and B in FIG. 26 are a composite of current flowing in the Schottky electrode 9 and the p-type well region 3. The curve B including the current flowing in the ohmic electrodes 8 has a lower rising voltage on the high current side. By optimizing the spread of current through the ohmic electrode 8, the rising waveform of the curve B may be further shifted to the constant voltage side. By reducing the rising voltage, a large power of current×voltage may be applied and the forward surge capability becomes increased.

As described above, according to the silicon carbide semiconductor device of the second embodiment, the ohmic electrode density in the chip increases from the chip center toward the outer periphery. As a result, the contact resistance near the contact portion with the element of the wire most susceptible to destruction may be lowered. Therefore, an increase of forward surge current of a 600, 1200V silicon carbide semiconductor device may be realized.

In the first embodiment and the second embodiment, although the pattern of the ohmic electrode 8 is focused on in improving forward surge capability, other parameters determining forward surge capability include bulk resistance of the p-type well region 3, bulk resistance of the n⁻-type drift layer 2, and operation resistance after a rise consequent to the film thickness of the n-type silicon carbide substrate 1. Reduction of these resistances is also necessary to improve forward surge capability.

However, concerning the convention ohmic electrode described above, an electrode material such as Ni or Al—Ni has to be processed at a high temperature of about 1000 degrees C. to form the conventional ohmic electrode. Therefore, a Schottky metal (for example, for titanium (Ti), an annealing temperature of 500 degrees C.) process cannot be performed concurrently, requiring a separate contact region to be provided. Further, with SiC, the operation resistance of the p-type diffusion region is large. In addition to this, it is difficult to make forward surge current flow uniformly in the chip, flow concentrates locally, and forward surge current cannot be achieved as expected.

According to the embodiments described above, the density of the ohmic electrodes in the chip increases from the chip center toward the outer periphery. Although at the contact part to the foundation of the Al wire, the current density rises and current distribution moves toward the outer peripheral side consequent to resistance change from temperature rise, the density of ohmic electrodes increases from the chip center toward the outer periphery, enabling surge current to flow uniformly in a plane. Therefore, an increase of forward surge current of a 1700V or higher silicon carbide semiconductor device may be realized.

Further, according to the embodiments above, the density of ohmic electrodes in the chip decreases from the chip center toward the outer periphery. As a result, contact resistance near the contact portion to the element of the wire most susceptible to destruction may be lowered. Therefore, an increase of forward surge current of a 1200V or less silicon carbide semiconductor device may be realized.

According to the silicon carbide semiconductor device and the method of manufacturing a silicon carbide semiconductor device of the present invention, an effect is achieved in that surge capability is increased and forward surge current may be enhanced.

As described, the semiconductor device and the method of manufacturing a semiconductor device according to the present invention are useful for high-power semiconductor devices used in power converting equipment and power supply devices such as in various industrial machines, and is particularly suitable for 600, 1200V, and 1700V or higher silicon carbide semiconductor devices.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
    a first semiconductor layer of a first conductivity type, formed on a front surface of a silicon carbide semiconductor substrate of the first conductivity type;
    a first semiconductor region of a second conductivity type, selectively formed in a surface layer of the first semiconductor layer;
    a second semiconductor region of the second conductivity type, selectively formed in the surface layer of the first semiconductor layer so as to be connected with the first semiconductor region, bottoms of the first semiconductor region and the second semiconductor region being located at a same depth relative to a surface of the first semiconductor layer and within the first semiconductor layer;
    a first electrode forming a Schottky contact with the first semiconductor layer and the first semiconductor region; and
    a second electrode forming an ohmic contact with the second semiconductor region,
    wherein
    a density of the second electrode per unit area of the silicon carbide semiconductor substrate in a plan view is higher at a center portion of the silicon carbide semiconductor substrate and decreases in a direction toward an outer peripheral side of the silicon carbide semiconductor substrate.

2. The silicon carbide semiconductor device according to claim 1, comprising
    an active region through which main current flows, the active region being formed on the silicon carbide semiconductor substrate; and
    an edge termination region surrounding a periphery of the active region, wherein
    the active region is constituted by the center portion and an outer peripheral portion surrounding the center portion,
    the second semiconductor region is formed in the center portion of the active region,
    the second electrode is formed on a surface of the second semiconductor region.

3. The silicon carbide semiconductor device according to claim 2, wherein
    the second electrode has one of a contiguous structure, a dot structure, and a stripe structure.

4. The silicon carbide semiconductor device according to claim 2, wherein the second electrode has a contiguous structure, such that the second electrode comprises a single electrode centered at the center portion of the silicon carbide semiconductor substrate, and the outer peripheral side of the silicon carbide semiconductor substrate has no second electrode thereon.

5. The silicon carbide semiconductor device according to claim 2, wherein the second electrode has a dot structure, such that the second electrode comprises a plurality of separate second electrodes spaced apart from each other, the plurality of separate second electrodes being spaced more densely toward the center portion of the silicon carbide semiconductor substrate than towards the outer peripheral side of the silicon carbide semiconductor substrate.

6. The silicon carbide semiconductor device according to claim 2, wherein the second electrode has a stripe structure, such that the second electrode comprises a plurality of second electrode stripes located closer to the center portion of the silicon carbide semiconductor substrate than to the outer peripheral side of the silicon carbide semiconductor substrate.

7. The silicon carbide semiconductor device according to claim 2, wherein
    the second electrode is an electrode to which is connected, a wire electrically connected an external destination.

8. The silicon carbide semiconductor device according to claim 7, comprising
    a passivation film covering the second electrode, wherein the wire is connected at an opening of the passivation film.

9. The silicon carbide semiconductor device according to claim 2, wherein element breakdown voltage is 1200V or less.

10. The silicon carbide semiconductor device according to claim 1, wherein the second electrode includes a plurality of second electrodes, and
    each of the second electrodes has a square shape.

11. The silicon carbide semiconductor device according to claim 1, wherein the second electrode includes a plurality of second electrodes, and
    the second semiconductor region includes a plurality of second semiconductor regions, such that each of the plurality of second electrodes forms the ohmic contact with a separate one of the plurality of second semiconductor regions.

12. The silicon carbide semiconductor device according to claim 1, further comprising a third semiconductor region of the second conductivity type, the third semiconductor region located in the outer peripheral side, the third semiconductor region having a higher impurity concentration than that of the first semiconductor layer,
    wherein bottoms of the first to third semiconductor regions are located at a same depth relative to the surface of the first semiconductor layer and within the first semiconductor layer.

13. A silicon carbide semiconductor device, comprising:
    a first semiconductor layer of a first conductivity type, formed on a front surface of a silicon carbide semiconductor substrate of the first conductivity type;
    a first semiconductor region of a second conductivity type, selectively formed in a surface layer of the first semiconductor layer;
    a second semiconductor region of the second conductivity type, selectively formed in the surface layer of the first semiconductor layer so as to be connected with the first semiconductor region;
    a first electrode forming a Schottky contact with the first semiconductor layer and the first semiconductor region; and a second electrode forming an ohmic contact with the second semiconductor region, wherein a density of the second electrode per unit area of the silicon carbide semiconductor substrate in a plan view is higher at a center portion of the silicon carbide semiconductor substrate and decreases in a direction toward an outer peripheral side of the silicon carbide semiconductor substrate, wherein the second electrode includes a plurality of second electrodes arranged such that a first group of two or more second electrodes is located at the center portion of the silicon carbide semiconductor device, in the plan view, and a second group of two or more second electrodes is closer to the outer peripheral side than the first group, wherein the two or more second electrodes in the first group are separated from each other by a distance less than a width of each of the two or more second electrodes in the first group, and the two or more electrodes in the second group are separated from each other by a distance greater than a width of each of the two or more second electrodes in the second group.

14. A silicon carbide semiconductor device, comprising:

a first semiconductor layer of a first conductivity type, formed on a front surface of a silicon carbide semiconductor substrate of the first conductivity type;

a first semiconductor region of a second conductivity type, selectively formed in a surface layer of the first semiconductor layer;

a second semiconductor region of the second conductivity type, selectively formed in the surface layer of the first semiconductor layer so as to be connected with the first semiconductor region;

a first electrode forming a Schottky contact with the first semiconductor layer and the first semiconductor region; and a second electrode forming an ohmic contact with the second semiconductor region, wherein a density of the second electrode per unit area of the silicon carbide semiconductor substrate as viewed from a plan view is higher at a center portion of the silicon carbide semiconductor substrate and decreases in a direction toward an outer peripheral side of the silicon carbide semiconductor substrate, and wherein the second semiconductor region abuts the first semiconductor region.

15. The silicon carbide semiconductor device according to claim 14, comprising an active region through which main current flows, the active region being formed on the silicon carbide semiconductor substrate; and an edge termination region surrounding a periphery of the active region, wherein the active region is constituted by the center portion and an outer peripheral portion surrounding the center portion, the second semiconductor region is formed in the center portion of the active region, the second electrode is formed on a surface of the second semiconductor region.

16. The silicon carbide semiconductor device according to claim 15, wherein the second electrode has one of a contiguous structure, a dot structure, and a stripe structure.

17. The silicon carbide semiconductor device according to claim 15, wherein the second electrode has a contiguous structure, such that the second electrode comprises a single electrode centered at the center portion of the silicon carbide semiconductor substrate, and the outer peripheral side of the silicon carbide semiconductor substrate has no second electrode thereon.

18. The silicon carbide semiconductor device according to claim 15, wherein the second electrode has a dot structure, such that the second electrode comprises a plurality of separate second electrodes spaced apart from each other, the plurality of separate second electrodes being spaced more densely toward the center portion of the silicon carbide semiconductor substrate than towards the outer peripheral side of the silicon carbide semiconductor substrate.

19. The silicon carbide semiconductor device according to claim 15, wherein the second electrode has a stripe structure, such that the second electrode comprises a plurality of second electrode stripes located closer to the center portion of the silicon carbide semiconductor substrate than to the outer peripheral side of the silicon carbide semiconductor substrate.

* * * * *